United States Patent [19]

Suzuki et al.

[11] Patent Number: 5,357,108
[45] Date of Patent: Oct. 18, 1994

[54] CANTILEVER TYPE DISPLACEMENT ELEMENT, AND SCANNING TUNNELING MICROSCOPE OR INFORMATION PROCESSING APPARATUS USING SAME

[75] Inventors: Yoshio Suzuki, Atsugi; Yutaka Hirai, Tokyo; Osamu Takamatsu; Masaru Nakayama, both of Atsugi; Takayuki Yagi, Machida; Yuji Kasanuki, Isehara; Keisuke Yamamoto, Yamato; Yasuhiro Shimada, Atsugi, all of Japan

[73] Assignee: Canon Kabushiki Kaisha, Tokyo, Japan

[21] Appl. No.: 895,621

[22] Filed: Jun. 9, 1992

[30] Foreign Application Priority Data

Jun. 11, 1991 [JP] Japan .................. 3-165282

[51] Int. Cl.$^5$ ............................. H01J 37/26
[52] U.S. Cl. ..................... 250/306; 369/126
[58] Field of Search .............. 250/306, 423 F; 369/126

[56] References Cited

U.S. PATENT DOCUMENTS

| | | | |
|---|---|---|---|
| 4,628,330 | 12/1986 | Suga | 346/75 |
| 4,638,206 | 1/1987 | Tsunooka et al. | 310/313 B |
| 4,672,496 | 6/1987 | Kanai et al. | 360/115 |
| 4,906,840 | 3/1990 | Zdeblick | 250/307 |
| 4,998,016 | 3/1991 | Nose et al. | 250/306 |
| 5,117,148 | 5/1992 | Nakamura et al. | 310/319 |
| 5,126,615 | 6/1992 | Takeuchi et al. | 310/330 |

FOREIGN PATENT DOCUMENTS

| | | | |
|---|---|---|---|
| 368579 | 11/1989 | European Pat. Off. | G01N 27/00 |
| 472342 | 8/1991 | European Pat. Off. | G11B 5/592 |
| 480645 | 10/1991 | European Pat. Off. | G01N 27/00 |

OTHER PUBLICATIONS

"Silicon as a Mechanical Material" by Kurt E. Petersen, Processing of IEEE, vol. 70, No. 5, May 1992; pp. 420–457.

"Microfabrication of integrated scanning tunneling microscope" by T. R. Albrech et al. Journal of Vacuum Science & Technology A; Second Series vol. 8, No. 1 Jan./Feb. 1990 pp. 317–318.

"New scanning tunneling microscopy tip for measuring surface topography" by Y. Akama et al. Journal of Vacuum Science & Technology A; Second Series vol. 8, No. 1 Jan./Feb. 1990 pp. 429–433.

"Etching of silicon (111) with the scanning tunneling microscope" by E. E. Ehrichs et al.; Journal of Vacuum Science & Technology A Second Series; vol. 1 Jan.-/Feb. 1990, pp. 571–573.

"Physical properties of thin-film filed emission cathodes with molybdenum cones" by C. A. Spindt et al.; Journal of Applied Physics vol. 47, No. 12 Dec. 1976; pp. 5248–5263.

"Microfabrication of Integrated Scanning Tunneling Microscope", Department of Applied Physics, Albrecht et al. (Jul. 10, 1989).

"Liquid-Jet Head", Patent Abstracts of Japan, Publ. No. JP3292147, (Dec. 12, 1991).

"Microfabricated Microscope Assembly", Publ. No. WO90/15986, Zdeblick et al., (Dec. 27, 1990).

"An Integrated Mass Storage Device", Publ. No. WO89/07256, Albrecht et al., (Aug. 10, 1989).

Primary Examiner—Bruce C. Anderson
Attorney, Agent, or Firm—Fitzpatrick, Cella, Harper & Scinto

[57] ABSTRACT

A cantilever type displacement element comprises a piezoelectric layer and at least two electrodes for applying a voltage to said piezoelectric layer, at least one of said electrodes being a comb-shaped electrode pair having respectively comb-tooth portions disposed separately as facing and alongside of each other in the width direction of the cantilever.

36 Claims, 16 Drawing Sheets

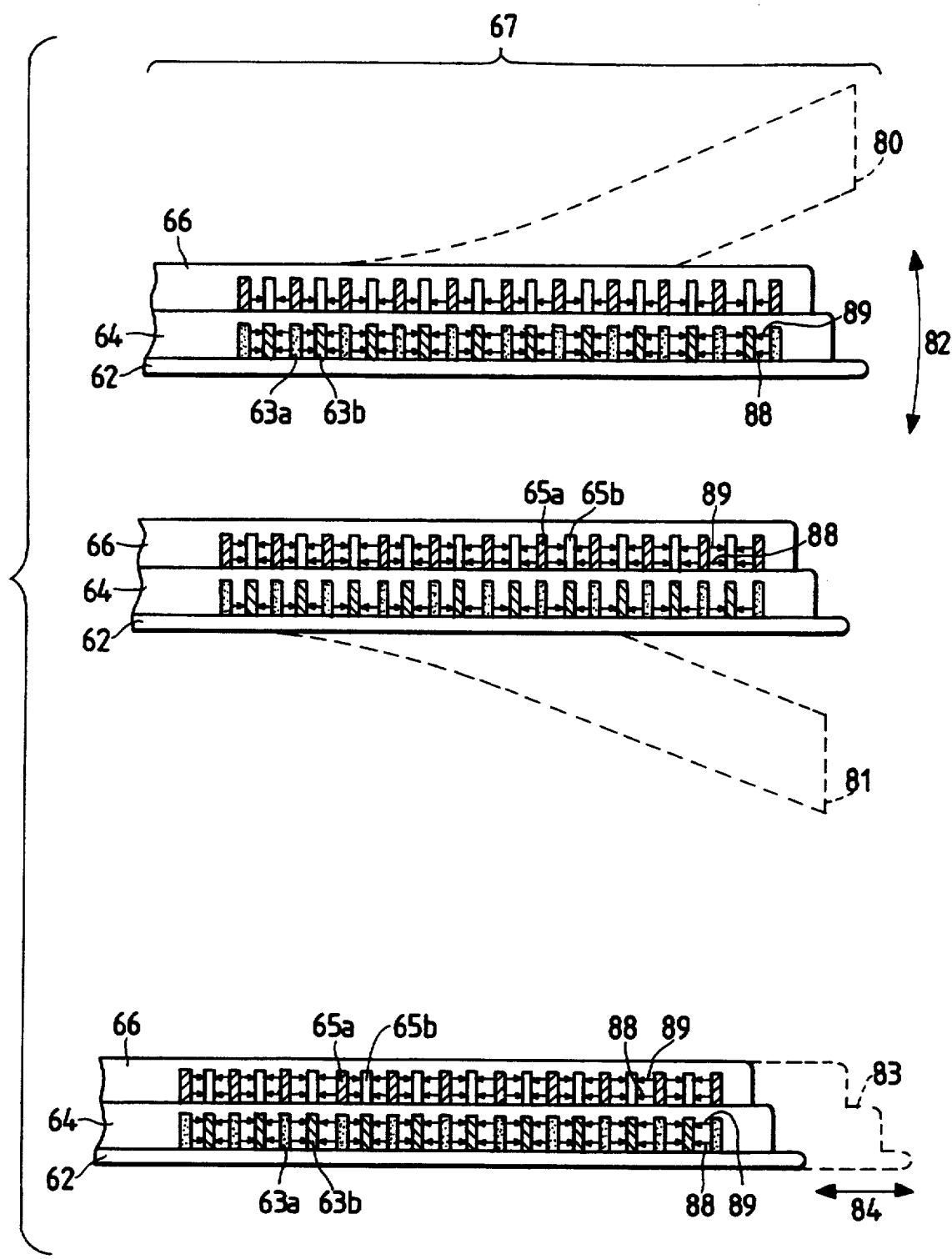

CANTILEVER TYPE DISPLACEMENT ELEMENT, AND SCANNING TUNNELING MICROSCOPE OR INFORMATION PROCESSING APPARATUS USING SAME

BACKGROUND OF THE INVENTION

1. Field of the Invention

The present invention relates to a scanning tunneling microscope (hereinafter referred to as "STM"), an information processing apparatus utilizing such a structure, and a displacement element which is used in these devices.

2. Related Background Art

In recent years, research has been conducted about the application of the techniques of an STM to various fields such as the observation/evaluation of semiconductors, polymeric materials or the like in an atomic order or a molecular order, fine processing (E. E. Ehrichs, 4th International Conference on Scanning Tunneling Microscopy/Spectroscopy, '89, S13-3), and recorders.

Above all, in the fields of calculation information and image information and the like of computers, the demand of recorders having a large capacity increases more and more, and with the advancement of semiconductor processing techniques, micro-processors are miniaturized and calculation power is enhanced. Thus, the miniaturization of the recorders is desired.

For the purpose of satisfying the above-mentioned demand, an information processor having a minimum recording area of 10 nm square has been suggested in which a work function on the surface of a recording medium is changed by applying a voltage to the surface of the recording medium from a probe for tunnel current generation provided on a driving means capable of finely adjusting a space between the recording medium and the probe, thereby writing information, while a change of a tunnel current attributed to the change of the work function is detected, thereby reading information.

In this type of processor, it is necessary to scan a sample which is the medium in the range of several nm to several μm by the probe, and in this case, a displacement element using a piezoelectric element is used as a moving mechanism.

FIGS. 22A and 22B show a conventional cantilever type displacement element. FIG. 22B is a sectional view taken along the line 22B—22B' in FIG. 22A.

As shown in FIGS. 22A and 22B, a lower electrode 223 is formed on an elastic member 221, and a piezoelectric layer 222 is then formed thereon. Furthermore, an upper electrode 224 is formed thereon so as to sandwich the piezoelectric layer 222, so that the cantilever can be bent by strain in a direction vertical to an electric field direction, i.e., expansion/contraction defined by a piezoelectric constant $d_{31}$, as is widely known in the art.

In addition, recently, an attempt has been made to finely prepare a probe driving mechanism by using a micro-machining technique (K. E. Peterson, Proceedings of the IEEE, Vol. 70, pp 420, 1982) in which a semiconductor processing technique is utilized. FIG. 23 shows an example in which a cantilever type STM probe comprising a piezoelectric bimorph is formed on an Si substrate by the micro-machining technique (T. R. Albrecht, Proceedings of 4th International Conference on Scanning Tunneling Microscopy/Spectroscopy, '89, S10-2).

FIG. 23 is the perspective view of the above-mentioned cantilever type STM probe. The cantilever is formed on an Si substrate 231 by laminating a lower electrode 223, a ZnO piezoelectric thin film 235, a medial electrode 233, a ZnO piezoelectric thin film 235 and an upper electrode 224, and a portion of the Si substrate under the cantilever is removed by anisotropic etching so that the cantilever is attached to the edge of the Si substrate to be overhung therefrom. A metal probe 238 is attached to the tip of the cantilever comprising this piezoelectric bimorph by adhesion or another means, and it detects a tunnel current through an outgoing electrode 237. In this case, as shown in a sectional view of FIG. 24, when a voltage is applied under control to two piezoelectric regions sandwiched between the upper electrodes 224 and the medial electrode 233 of the cantilever as well as two piezoelectric regions sandwiched between the lower electrodes 223 and the medial electrode 233, the cantilever can be moved three-dimensionally moved. In this conventional example, Al is used as the electrodes, and so silicon nitride is interposed between ZnO and the electrode. FIGS. 25A, 25B and 25C show the movement of the cantilever at the time when the cantilever is driven by changing the combination of the voltage application regions of the four piezoelectric regions divided by the two-divided electrodes. FIG. 25A shows the movement of the cantilever at the time when an in-phase voltage is applied so that the four regions may simultaneously contract, and the probe moves in a Y direction in the drawing. In FIG. 25B, the two upper and lower regions on the right side stretch and the two upper and lower regions on the left side contract, and in this case, the probe can move in an X direction in the drawing. Furthermore, in FIG. 25C, the right and left regions on the upper side contract and the right and left regions on the lower side stretch, and in this case, the probe can move in a Z direction in the drawing.

The micro-machining technique permits the fine formation of a probe driving mechanism, and also permits the easy production of a plural number of probes which are required to increase the speed of writing and reading of the information of the information processor.

When the piezoelectric constants d in various directions which are the measures of the degree of defromation to the voltage are compared with each other, it can be understood that in typical piezoelectric materials such as ZnO, AlN and PZT, piezoelectric sliding deformation $d_{15}$ and $d_{33}$ are larger than a piezoelectric lateral effect $d_{31}$.

However, the cantilever type displacement element using conventional parallel plate electrodes shown in FIGS. 22A and 22B mainly utilizes the piezoelectric lateral effect $d_{31}$. In order to further increase the displacement, it is preferable to utilize $d_{15}$ or $d_{33}$.

In the case that the elastic member 221 and the piezoelectric layer 222 are different in thermal expansion coefficients, strain occurs in the plane of the cantilever, which impedes an accurate operation.

In the device shown in FIG. 23, in order to decrease the thickness of the respective constitutional layers and to thereby increase the displacement, the thickness and stress of the respective layers must be sufficiently controlled in laminating the electrodes and the piezoelectric thin films, because the strain of the prepared cantilever takes place dependent upon the thickness and stress of the respective layers. In the probe which is displaceable in the three-dimensional direction shown in FIG. 23, the five-layer portion and the three-layer portion are present in terms of layer structure including ZnO and electrode, and when a stress difference occurs between the respective layers, the strain takes place in the plane of the cantilever at times. That is, the mechanical resonance frequencies in the X, Y and Z directions will change owing to the deformation, with the result that a displacing capacity of the displacement element cannot be sufficiently utilized.

Incidentally, the strain in the plane means the maximum displacement of the strain from the cantilever plane.

SUMMARY OF THE INVENTION

The present invention has been attained to solve the above-mentioned problems.

An aspect of the present invention is to provide a cantilever type displacement element comprising a piezoelectric layer and at least two electrodes for applying a voltage to said piezoelectric layer, at least one of said electrodes being a comb-shaped electrode pair having respectively comb-tooth portions disposed separately as facing and alongside of each other in the width direction of the cantilever.

Another aspect of the present invention is to provide a cantilever type displacement element comprising a first piezoelectric layer, a second piezoelectric layer laminated thereon, and first and second comb-shaped electrode pairs provided respectively in said first and second piezoelectric layers for applying a voltage displacing the first and second piezoelectric layers by a reverse piezoelectric effect, each of said electrode pairs having respectively comb-tooth portions disposed separately as facing and alongside of each other in the width direction of the cantilever.

Still another aspect of the present invention is to provide a cantilever type displacement element comprising a piezoelectric layer and a comb-shaped electrode pair provided in said piezoelectric layer for applying a voltage displacing the piezoelectric layer by a reverse piezoelectric effect, said piezoelectric layer having a polarization axis oriented in the direction of its thickness, said electrode pair having respectively comb-tooth portions disposed separately as facing and alongside of each other in the width direction of the cantilever.

Still another aspect of the present invention is to provide a displacement element array comprising a plural number of the displacement elements mentioned above.

Still another aspect of the present invention is to provide a scanning tunneling microscope comprising the displacement element or displacement element array mentioned above, a means for displacing/driving said element and a voltage application circuit connected to the probe of said element, said probe being adapted to be positioned in a close proximity of a sample to be observed for applying a voltage therebetween to generate an electrical current and detecting the current to output the surface information of the sample based on the current detected.

Still another aspect of the present invention is to provide an information processing apparatus comprising the displacement element or displacement element array mentioned above, a means for displacing/driving said element and a voltage application circuit connected to the probe of said element, said probe being adapted to be positioned in a close proximity of a recording medium for applying a voltage therebetween to write and/or read an information into or out of said medium.

According to the present invention, there can be provided an excellent displacement element which can solve the above-mentioned problems, and therefore an STM and an information processing apparatus which are more excellent than conventional ones can be provided.

In particular, when the pair of comb-shaped electrodes are buried in the piezoelectric layer, contraction by a reverse piezoelectric effect of $d_{33}$ can be more effectively converted into the bending of the cantilever portion. Moreover, these structures are laminated to form a two-layer constitution, and so the cantilever can be bent in both upper and lower directions without utilizing the restoring force of an elastic member. This constitution does not contain any elastic layer, and a load necessary to deform the elastic member is therefore reduced, so that it is possible to increase the displacement at the same voltage. Moreover, when an additional pair of comb-shaped electrodes are disposed in the same piezoelectric layer, the cantilever can be bent in the left-and-right directions besides the upper-and-lower directions.

Further, when a pair of comb-shaped electrodes comprising the two upper and lower layers are disposed with the interposition of the insulating layer therebetween, and the space between these electrodes is packed with the piezoelectric layer comprising the thin film having the polarization axis oriented vertically to the cantilever surface, a thickness sliding deformation $d_{15}$ which has not been utilized can be converted into the bending movement of the cantilever. Since the formation of the piezoelectric layer comprising the two upper and lower layers can be carried out by one operation, the accurate control can be achieved without giving rise to any difference of properties of the upper and lower layers.

In addition, the above-mentioned cantilever type displacement element can be provided with the probe and the outgoing electrode to form the cantilever type probe. When this cantilever type probe is formed by a gaseous phase thin film formation technique and a fine processing technique using photolithography, miniaturization and integration can be achieved, whereby a multi-probe array, as well as an STM and an information processing apparatus using it, can be provided which have not been heretofore present.

BRIEF DESCRIPTION OF THE DRAWINGS

FIG. 8 is a view illustrating the functional principle of the second cantilever type displacement element of the present invention.

DESCRIPTION OF THE PREFERRED EMBODIMENTS

Now, the present invention will be described in detail in reference to examples.

Example 1

Figure 1:
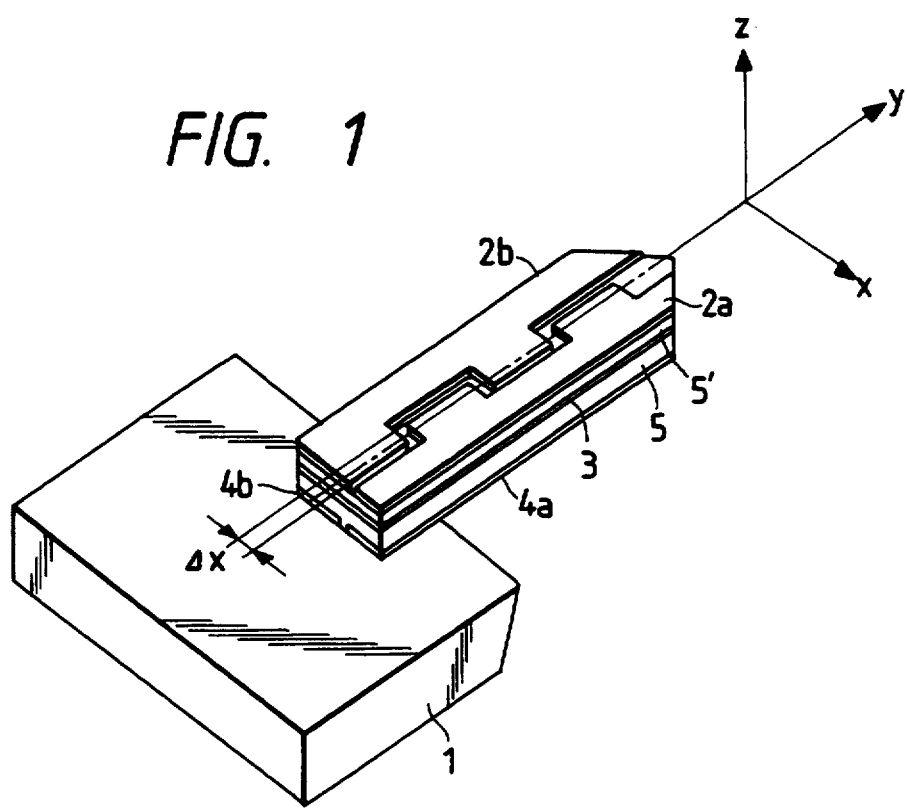
FIG. 1 is a perspective view illustrating one example of the first cantilever type displacement element of the present invention.

FIG. 1 shows one example of a first cantilever type displacement element of the present invention.

Figure 2:
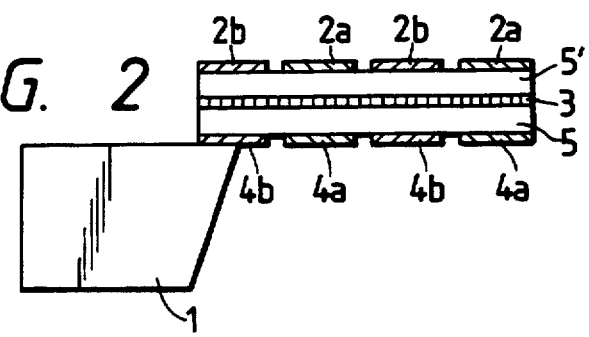
FIG. 2 is a sectional view of the first cantilever type displacement element of the present invention.

FIG. 1 shows a perspective view of a displacement element comprising piezoelectric thin films 5, 5' and electrodes 2a, 2b, 3, 4a and 4b to which a bias voltage is applied in order to displace these piezoelectric thin films. FIG. 2 shows a sectional view along a cantilever length in a Y axis direction of the displacement element.

The cantilever type element of this example can be prepared as follows: Si nitride films having a thickness of 5000 Å are formed on both the surfaces of an Si substrate 1 having a crystal orientation (100) surface as the main surface by an LPCVD (CVD under reduced pressure), and the Si nitride film on the back surface of the substrate is partially removed by photolithography and a reactive ion etching process. Afterward, an Si membrane having a thickness of 30 μm is formed with a 27 wt % aqueous KOH solution at 110° C. by anisotropic etching in which an etching rate difference of the Si crystal orientation surface is utilized, and an Au electrode and a ZnO thin film are successively formed as patterned and laminated on the surface of the substrate. Finally, the Si membrane is removed from the back surface by the reactive ion etching process, thereby forming the cantilever type displacement element.

In this case, the Au electrode film is formed as thick as 0.1 μm by a vacuum resistance heating deposition process, and the ZnO piezoelectric film is formed as thick as 0.3 μm on the Si substrate heated to 200° C. by sputtering a ZnO target in an $O_2$ and Ar mixed atmosphere by a magnetron sputtering process. The patterning of bimorph is carried out by photolithography. As an etching solution, an aqueous potassium iodide solution is used for the Au electrode, and an aqueous acetic acid solution is used for the ZnO film. However, in order to heighten the adhesion between Au and Si, a Cr film having a thickness of 20 Å is formed by a vacuum deposition process prior to the formation of an Au lower electrode 4 of the first layer.

With regard to this element, its length is 1 mm and its width is 200 μm. In FIG. 1, an overlap ΔX of the electrodes 2a, 2b and 4a, 4b is 30 μm.

Figure 23:
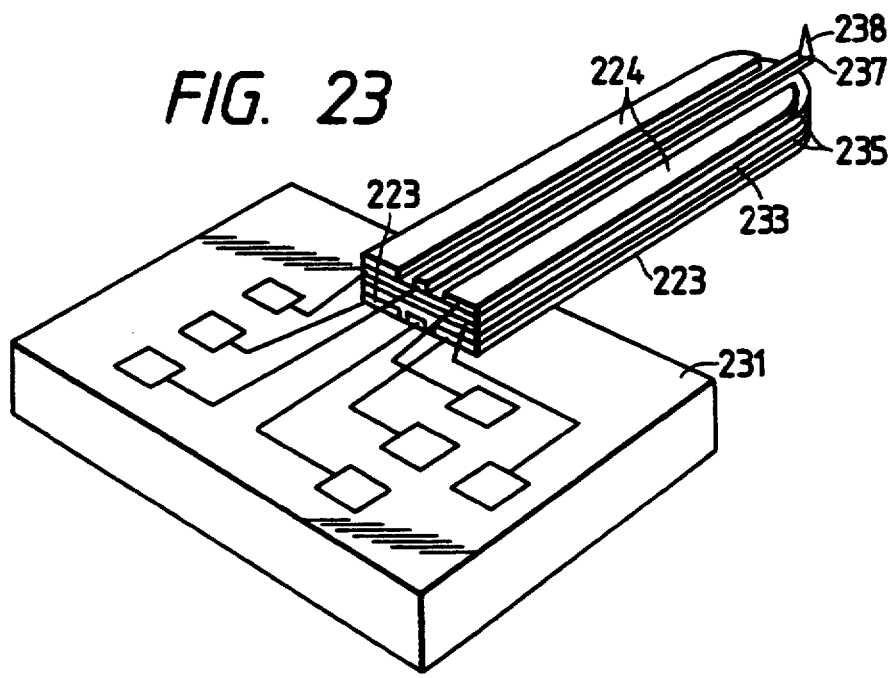
FIG. 23 is a perspective view of the conventional example of the cantilever type probe.
Figure 24:
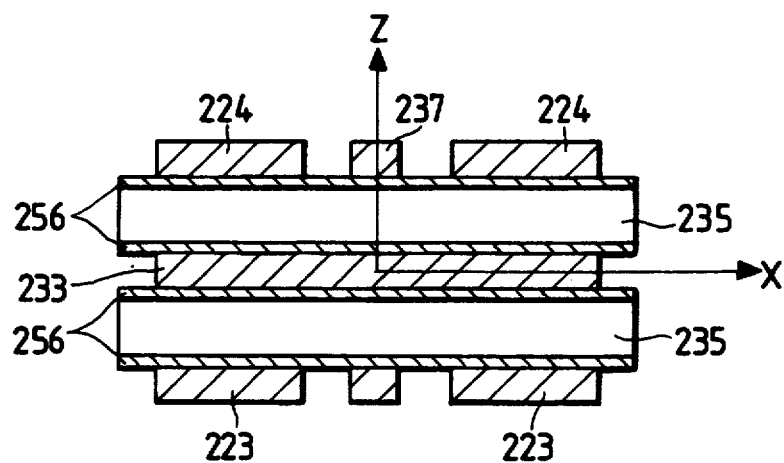
FIG. 24 is a sectional view of the conventional example of the cantilever type probe.
Figure 25A:
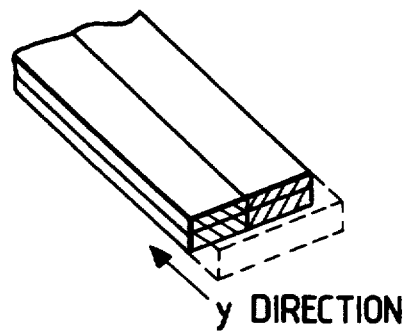
FIGS. 25A to 25C are schematic views illustrating the movement of the probe at the time when a voltage is applied to a piezoelectric layer of the displacement element.
Figure 25B:
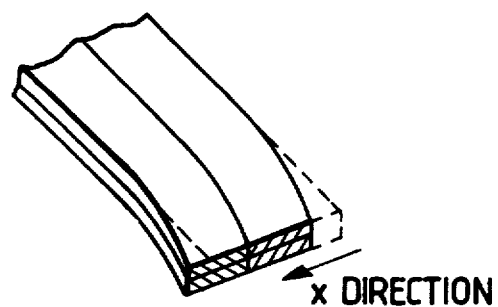
Figure 25C:
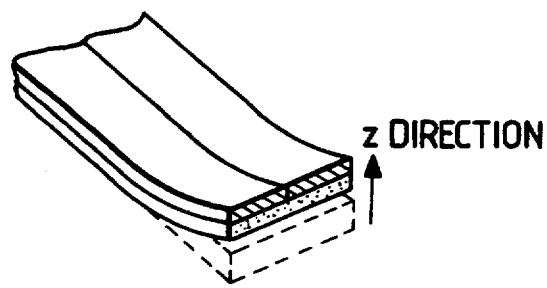

Table 1 shows measured values of surface strain at the tip of the thus prepared cantilever type displacement element, mechanical resonance frequency, and displacement of the tip of the cantilever in the Z direction at the time when a medial electrode 3 is earthed and a bias voltage of 1 V is applied to the upper electrodes 2a, 2b and the lower electrodes 4a, 4b. A "conventional example" in the item of electrode constitution in this table has a structure shown in FIG. 23, and in the case of "both upper and lower electrodes", the electrodes 2a, 2b and 4a, 4b have electrode structures shown in FIG. 1. In "upper electrodes only", the electrodes 4a, 4b have a conventional electrode structure and the electrodes 2a, 2b have the electrode structure shown in FIG. 1. The case of "lower electrodes only" has the reverse structure of the case of "upper electrodes only". The layer structure in each case is as shown in this example.

TABLE 1

| Electrode Structure | Surface Strain | Resonance Frequency | Displacement |
| --- | --- | --- | --- |
| Upper Electrode Only | 6 μm | 700 Hz | 6 μm/V |
| Lower Electrode Only | 5 μm | 690 Hz | 6.5 μm/V |
| Both Upper and Lower Electrodes | 2 μm | 650 Hz | 8 μm/V |
| Conventional Example | 10 μm | 750 Hz | 4.5 μm/V |

As is apparent from the results in Table 1, the strain can be reduced by intersecting the electrodes in a comb form in a width direction, so that the displacement can be improved. Furthermore, the resonance frequency values also decrease along with the reduction of the strain values. This would be due to the reduction of the strain values, the decrease of apparent stiffness in the Z direction, and the approach of mechanical properties of the displacement element to ideal values in order to attain stabilization.

In this example, the overlap ΔX of the electrodes 2a, 2b and 4a, 4b seen from the Y direction in FIG. 1 is 30 μm, but it is only required that they are constituted so as to substantially overlap each other.

Furthermore, as is apparent from the results in Table 1, the improvement of the displacement can be achieved even by allowing only the upper or lower electrodes to have the electrode structure of the present invention.

In the above-mentioned cases, ZnO is used, but needless to say, the material of the piezoelectric film to be used in the present invention may be AlN, $BaTiO_3$, PZT, $PbTiO_3$ or the like having the piezoelectric effect.

Example 2

Figure 3:
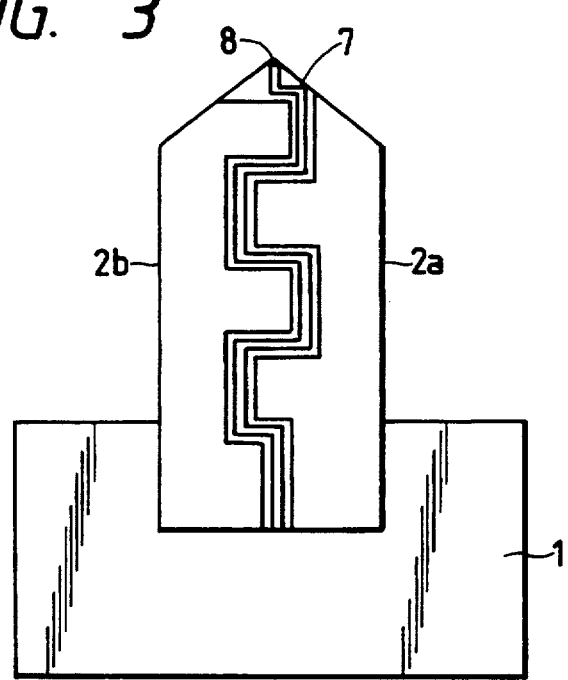
FIG. 3 is an electrode arranging constitutional plan illustrating one example of a cantilever type probe of the present invention.

FIG. 3 shows one example of a cantilever type probe of the present invention in which an outgoing electrode 7 for a probe is disposed between two-divided electrodes of a cantilever type displacement element (having both the upper and lower electrodes) of Example 1.

Although not shown in any drawings, the probe can be prepared by the use of a thin film cathode method using a vacuum deposition process after the formation of a bimorph beam in Example 1 (C. A. Spindt, J. Appl. Phys., 47, pp 5248, 1976), an electron-beam deposition method (Y. Akama. 4th International Conference on Scanning Tunneling Microscopy/Spectroscopy, '89, P2-39, pp 126) and a method of utilizing the adhesion of metallic fine particles. In the present invention, a $CH_4$ gas is decomposed in a $CH_4$ gas atmosphere by the electron-beam deposition method to form a probe 8 on the tip of the outgoing electrode 7.

Figure 4:
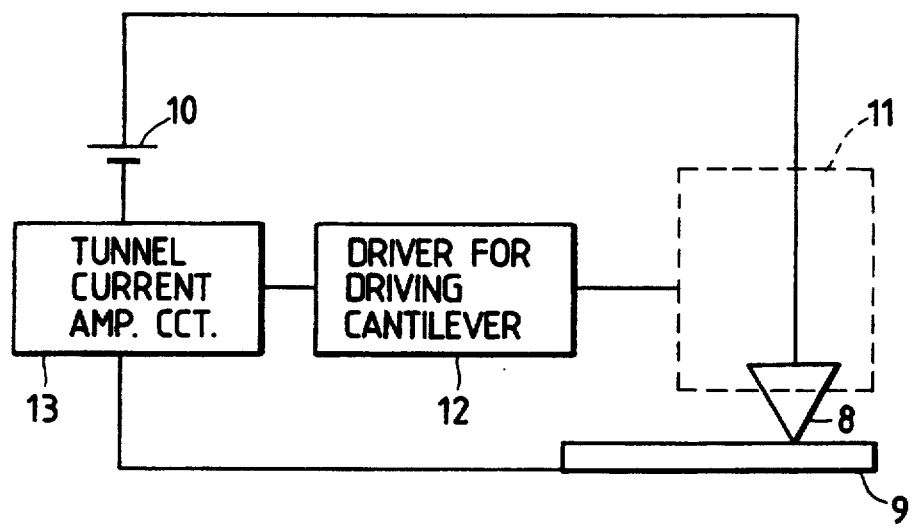
FIG. 4 is an illustrative view of an STM of the present invention.

An STM apparatus is prepared by the use of the cantilever type probe of the present invention. The block diagram of the thus prepared STM apparatus is shown in FIG. 4. An image observation can be carried out as follows: The probe 8 is brought close to a sample 9 by the displacement element described in Example 1, and the surface of the sample 9 is scanned by an X-Y stage 11 equipped with the displacement element. A tunnel current observed at this time is read by a tunnel current amplifying circuit 13 to observe the image. The control of the space between the sample 9 and the probe 8 and the scanning control of the X-Y stage 11 can be carried out by a driver 12 for driving the cantilever. Although not shown in any drawings, the scanning by the X-Y stage 11 is performed by a control mechanism comprising a cylindrical piezoactuator, a parallel spring, a differential micrometer, a voice coil, an inchworm and the like.

In this apparatus, the surface observation of the sample 9 is made by the use of an HOPG (highly oriented graphite) substrate. A DC voltage of 200 mV is applied to between the probe 8 and the sample 9 by a bias circuit 10. In this state, the sample 9 is scanned by the probe 8, and the surface observation is achieved by signals detected by the use of the tunnel current amplifying circuit 13. In this case, a scan area is 100 Å × 100 Å, and a good atomic image can be obtained.

Example 3

Figure 5:
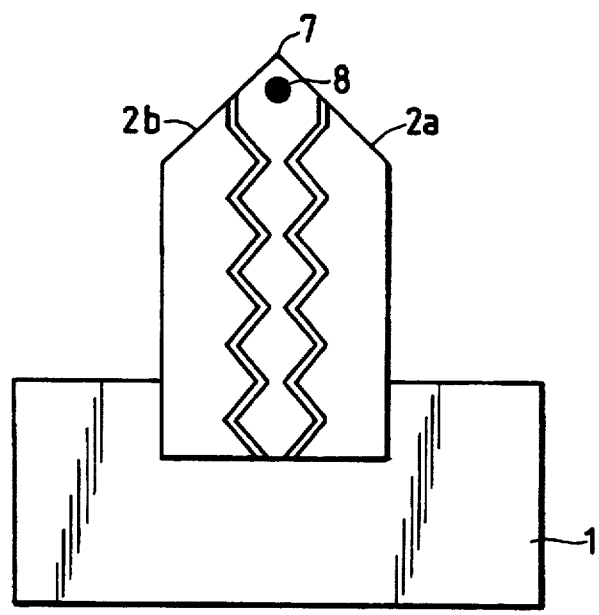
FIG. 5 is another electrode arranging constitutional plan of the cantilever type probe of the present invention.

FIG. 5 shows another embodiment of a probe of the present invention. In this example, an outgoing electrode 7 is interconnected in a comb state with upper electrodes 2a, 2b for driving a piezoelectric thin film. The surface observation of HOPG is made by an apparatus shown in FIG. 4 utilizing the probe shown in FIG. 5, and as a result, the same good image observation as in Example 2 can be achieved.

The above-mentioned constitution can provide the micro-probe for a tunnel current measurement which permits adjusting a space between the probe and a sample.

Example 4

Figure 6:
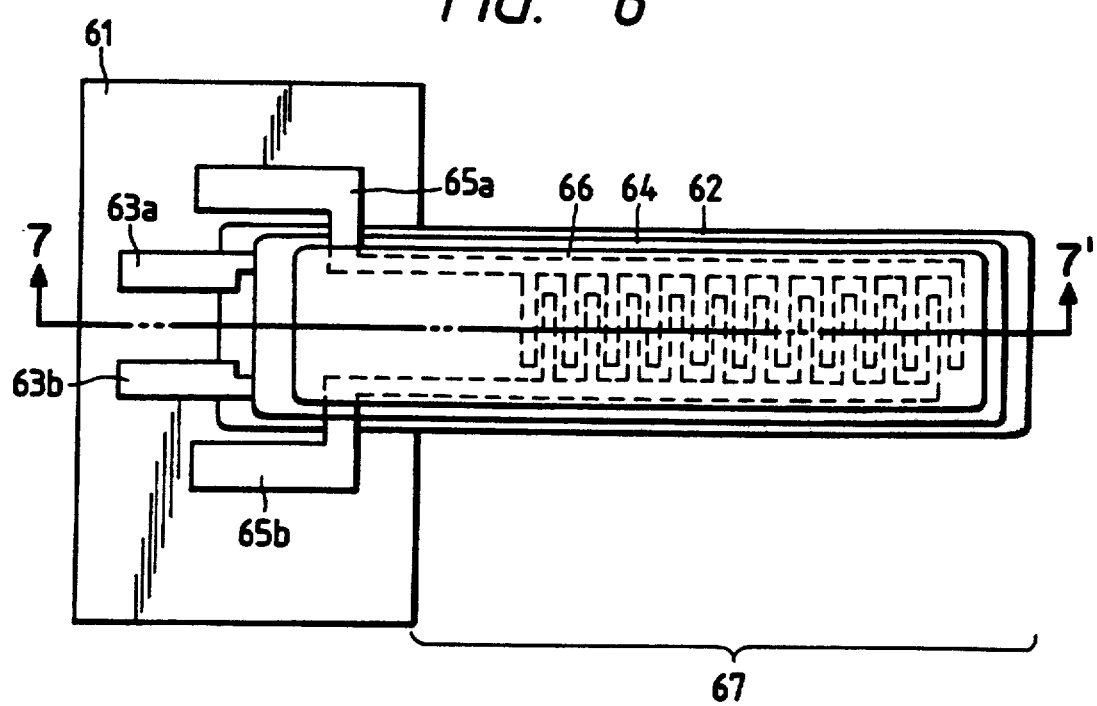
FIG. 6 is a plan of one example of the second cantilever type displacement element of the present invention.
Figure 7:
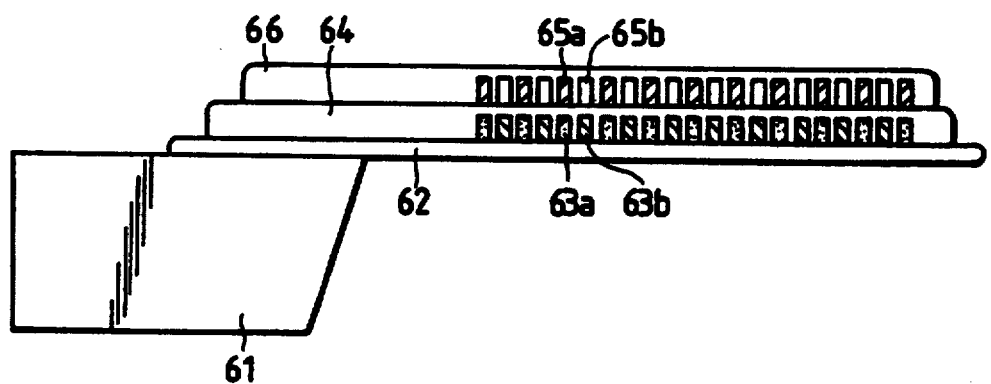
FIG. 7 is a sectional view of the second cantilever type displacement element of the present invention.

FIGS. 6 and 7 show the second cantilever type displacement element of the present invention.

FIG. 7 is a sectional view taken along the dotted line 7—7' in FIG. 6.

In the same drawing, a substrate 61 is made of a single crystal Si, and on this substrate 61, there is disposed a piezoelectric layer 62 whose one end is fixed on the substrate 61. Furthermore, comb-shaped electrodes 63a, 63b are formed so as to face to each other on the above-mentioned piezoelectric layer 62. A piezoelectric layer 64 is formed so as to completely cover the comb portion of the electrodes 63a, 63b, and comb-shaped electrodes 65a, 65b are further formed on the above-mentioned piezoelectric layer 64. These electrodes 65a, 65b are also arranged so that the comb-shaped portions thereof may face each other. In addition, a piezoelectric layer 66 is formed so as to completely cover the electrodes 65a, 65b. The above-mentioned constitution results in the formation of a cantilever portion 67.

FIG. 8 shows a portion of a sectional view taken along the dotted line 7—7' in FIG. 6 and elucidates the drive principle of the displacement element in this example. A high voltage is first applied to the comb-shaped electrodes 63a, 63b and 65a, 65b to subject a ferroelectric material of the piezoelectric layer 62, 64, 66 to a polarization treatment. That is, the high voltage is applied in the direction of from the electrode 63a to 63b and from the electrode 65a to 65b, and in consequence, a polarization 88 occurred in an arrow direction in the piezoelectric layer 64, 66 made of the ferroelectric material. This polarization treatment is carried out during or after the formation of the piezoelectric layers 64, 66, while heated at a Curie temperature or more. After completion of the polarization treatment, a drive voltage 89 denoted by arrows is applied to the electrodes 63a, 63b in the same direction as in the case of the polarization, and at this time, the piezoelectric layer 64 gave rise to strain defined by $d_{33}$, so that the displacement element is stretched in a direction parallel with the voltage application direction and consequently the cantilever portion 67 is deformed as shown by a dotted line 80.

Next, a drive voltage 89 is applied to the electrodes 65a, 65b in the same direction as in the polarization 88, so that the piezoelectric layer 66 is expanded in a direction parallel with the drive voltage 89 by the strain of the above-mentioned $d_{33}$ and the cantilever portion 67 is deformed as shown by a dotted line 81. As is apparent from the foregoing, the application of the predetermined voltage to the electrodes 63a, 63b and 65a, 65b permits optionally displacing the cantilever 67 in the direction denoted by an arrow 82. Furthermore, the simultaneous application of the drive voltage 89 to the electrodes 63a, 63b and 65a, 65b permits displacing the cantilever 67 as denoted by a dotted line 83 and also permits having a degree of freedom in a direction denoted by an arrow 84.

Figure 9A:
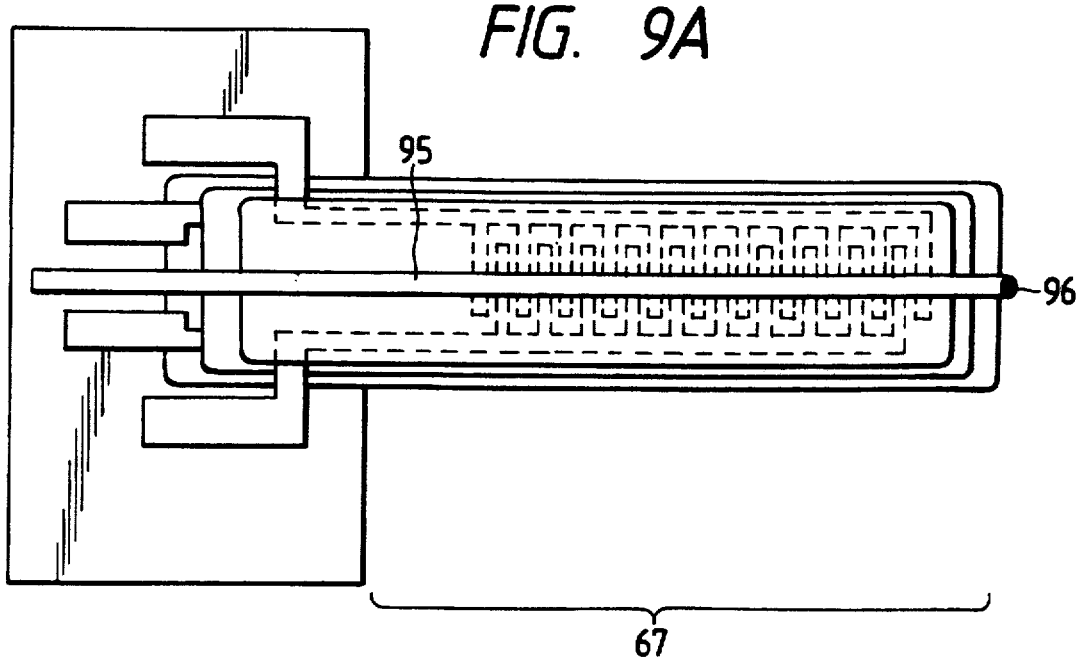
FIGS. 9A and 9B are views illustrating one example of the cantilever type probe of the present invention.
Figure 9B:
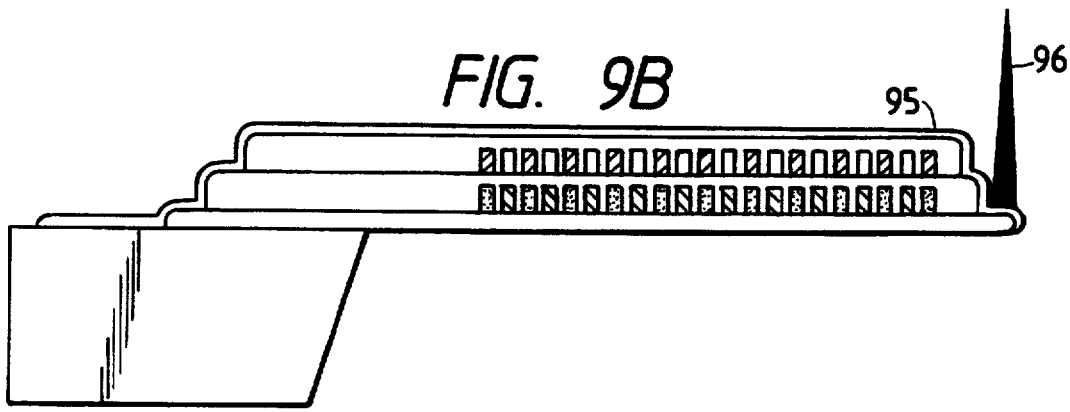

In the present invention, as shown in FIGS. 9A and 9B, an outgoing electrode 95 is provided on the cantilever portion 67, and a conductive probe 96 having a sharp tip is attached so as to come in contact with the outgoing electrode 95 at the tip of the cantilever portion 67.

Figure 10:
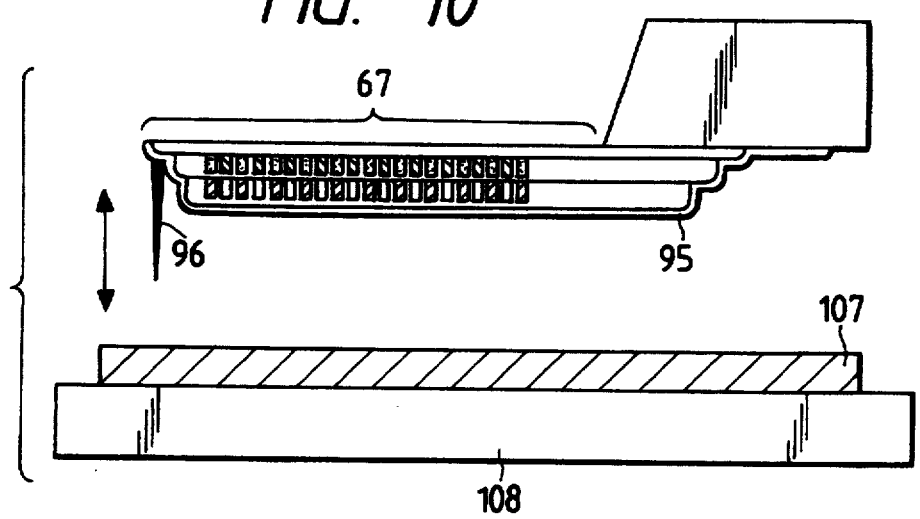
FIG. 10 is a schematic view of the STM in which the second displacement element of the present invention is used.

After completion of the above-mentioned constitution, an STM is prepared in accordance with this example shown in FIG. 10. That is, the above-mentioned probe 96 is used as a probe for tunnel current detection, and a predetermined voltage is applied to the electrodes 63a, 63b, 65a, 65b to deform the cantilever portion 67, whereby the probe 96 is brought close to the surface of a sample 107 so that a space therebetween may be from 1 to 10 nm, and a tunnel current is then measured. The sample 107 is fixed on an X-Y stage 108 having a fine moving mechanism in a surface vertical to an operation direction of the probe 96, and the sample 107 is scanned in a micro-area of the X-Y surface, and the cantilever portion 67 is finely displaced by the probe 96 so that the tunnel current may be constant, thereby obtaining an atomic image of the surface of the sample 107.

Next, one embodiment of a method for preparing a cantilever type displacement element having comb-shaped electrodes therein as used in this example will be described in reference to FIGS. 11A–11D and 12E–12H.

In the first place, the piezoelectric layer 62 is formed by sputtering deposition on the single crystal Si substrate 61 on which an $SiO_2$ insulating layer has been previously formed by thermal oxidation. At this time, the formation of the piezoelectric layer is carried out by concealing an area which will be an outgoing portion of the comb-shaped electrodes so that the piezoelectric layer may not be formed on this area. Thus, such a structure as shown in FIG. 11A can be formed.

Figure 11A:
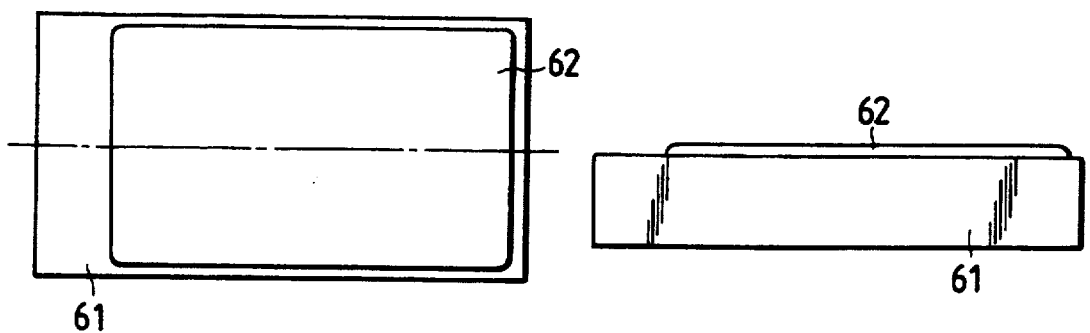
FIGS. 11A to 11D are views illustrating a preparation process of the second cantilever type displacement element of the present invention.
Figure 11B:
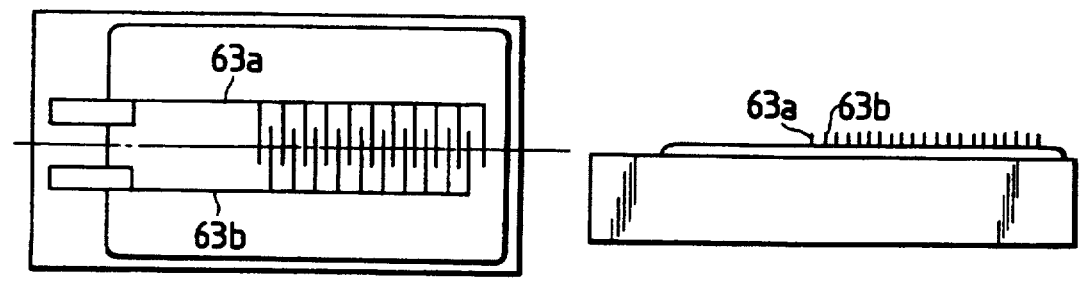
Figure 11C:
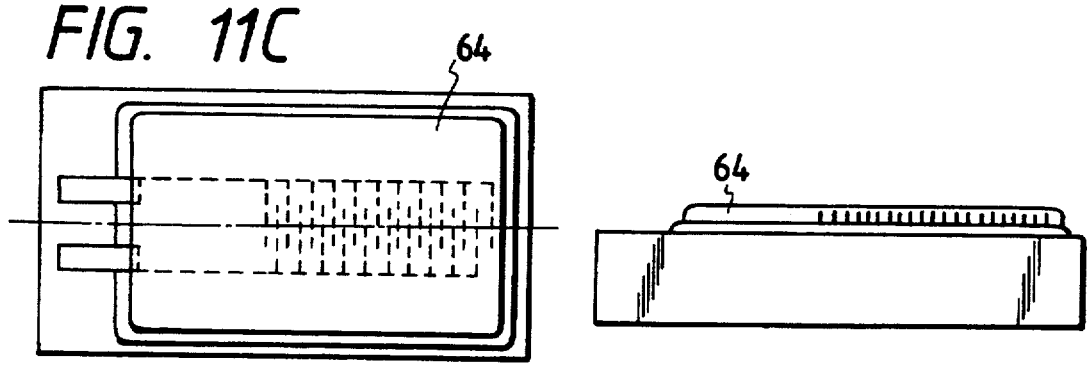

Next, Au which is the material of the comb-shaped electrodes is deposited to form an Au film on the surface of the structure shown in FIG. 11A. This Au film is then coated with a photoresist, and patterning is then performed by photolithography. The unnecessary Au is removed by etching to form the comb-shaped electrodes 63a, 63b, whereby a structure shown in FIG. 11B is obtained.

On this structure, the piezoelectric layer 64 is formed in the same manner as in the above-mentioned piezoelectric layer 62. At this time, the piezoelectric layer 62 is formed so as to be thicker than the above-mentioned electrodes 63a, 63b. This operation led to the preparation of a structure shown in FIG. 11C.

Figure 11D:
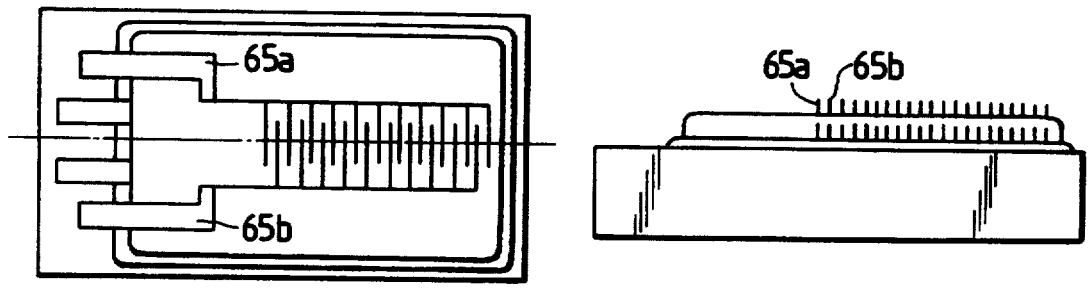

On this structure, Au is further deposited, and patterning is carried out in the same manner as in the above-mentioned electrodes 63a, 63b to form the comb-shaped electrodes 65a, 65b, thereby obtaining a structure shown in FIG. 11D. In this example, the constitution is given so that the electrodes 65a, 65b may be put just over the electrodes 63a, 63b, but it is not always necessary. The electrodes 65a, 65b may be diverted forward or backward, or right or left.

Figure 12E:
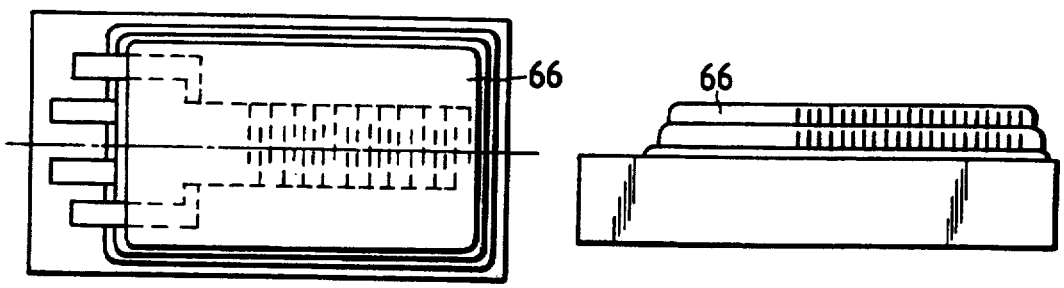
FIGS. 12E to 12H are views illustrating a preparation process of a probe in which the second cantilever type displacement element of the present invention is used.
Figure 12F:
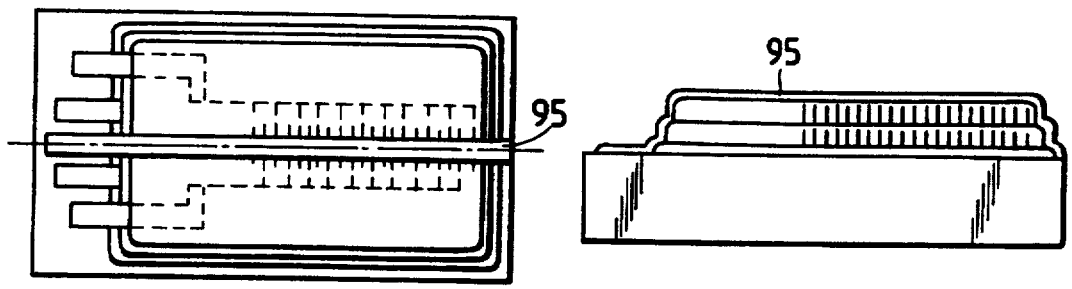

Next, the piezoelectric layer 66 is formed in the same manner as in the case of the above-mentioned piezoelectric layers 62, 64, thereby obtaining a structure shown in FIG. 12E.

Afterward, a Cr film having a thickness of about 30 Å is vapor-deposited, and Au is further vapor-deposited thereon. Then, patterning is carried out by photolithography to form an outgoing electrode 15 shown in FIG. 12F.

Figure 12G:
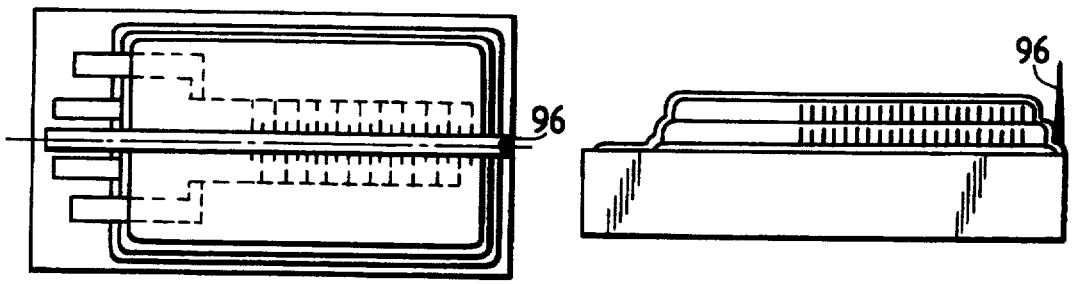
Figure 12H:
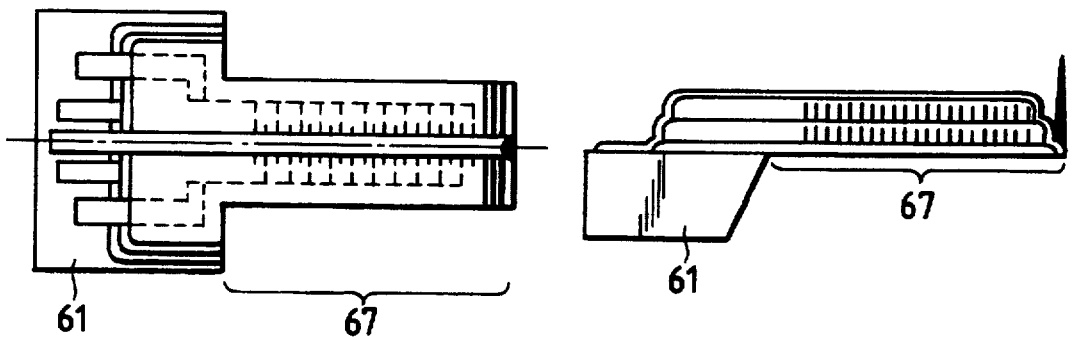

Afterward, a photoresist having a thickness of about 5 μm is applied all over the surface, and patterning is carried out by photolithography to remove the resist only from a position where the probe 96 will be formed. That is, the constitution is made so that the resist may not be present only on the trapezoidal position where the probe 96 will be formed. Then, Ag is vapor-deposited from a direction oblique to the substrate surface, while the substrate 61 is rotated. Next, the resist on which the Ag film is already formed is removed together with the Ag film to form the conical probe 96. This state is shown in FIG. 12G.

Next, the back surface of the Si substrate 1 is etched by the use of anisotropic etching to the single crystal Si of a KOH solution to remove Si therefrom except an Si portion which will be the base of the cantilever portion 67. Simultaneously, the piezoelectric layer on the surface is irradiated with a laser beam from an Nd:YAG laser, whereby processing is carried out by the utilization of selective etching on a laser beam-irradiated portion, thereby forming a structure having the cantilever portion 67 shown in FIG. 12H.

Afterward, the whole of the structure is heated to 300° C., and a polarization voltage is then applied to the electrodes 63a, 63b, 65a, 65b to achieve a polarization treatment.

In this example, PZT is used as the material of the piezoelectric layers 62, 64, 66, but other ferroelectric materials such as $PbTiO_3$ and $BaTiO_3$ can be also used. Furthermore, no restriction is put on a formation process, and MOCVD or the like is also acceptable. Metal kinds for the electrodes 63a, 63b, 65a, 65b, the outgoing electrode 95 and the probe 96 are not limited to those which are used in this example, and other metal kinds and conductive ceramics can be instead employed, so long as their electrical resistance, melting point and etching properties are suitable for the manufacturing conditions.

Sizes of the respective members are as follows:

The thickness of the Si substrate 61 = 1 mm, the thickness of the piezoelectric layer 62 = 0.2 μm, the thickness of the piezoelectric layers 64, 66 = 0.5 μm, the thickness and the width of the comb-shaped electrodes 63a, 63b, 65a, 65b = 0.3 μm and 1 μm, respectively, the space between the electrodes 63a and 63b and between the electrodes 65a and 65b = 2 μm, the number of comb-shaped portions of the electrodes 63a, 63b, 65a, 65b = 50, the length and the width of the cantilever portion 67 = 200 μm and 50 μm, respectively, and the length of the probe 96 = 3 μm.

The element having such a structure is then subjected to a polarization treatment by applying a voltage of 20 V to the electrodes 63a, 63b and the electrodes 65a, 65b.

With regard to this element, 5 V which is a drive voltage 89 is alternately applied to the electrodes 63a and 63b as well as the electrodes 65a and 65b, and in this case, the amplitude of the tip of the cantilever portion 67 is ±1.0 μm.

In this example, in order to prevent the relaxation of polarization, the drive voltage 89 and the polarization 88 are given in the same direction, but when the drive voltage is applied in a direction opposite to the polarization direction, a further larger amplitude can be obtained.

Example 5

Figure 13A:
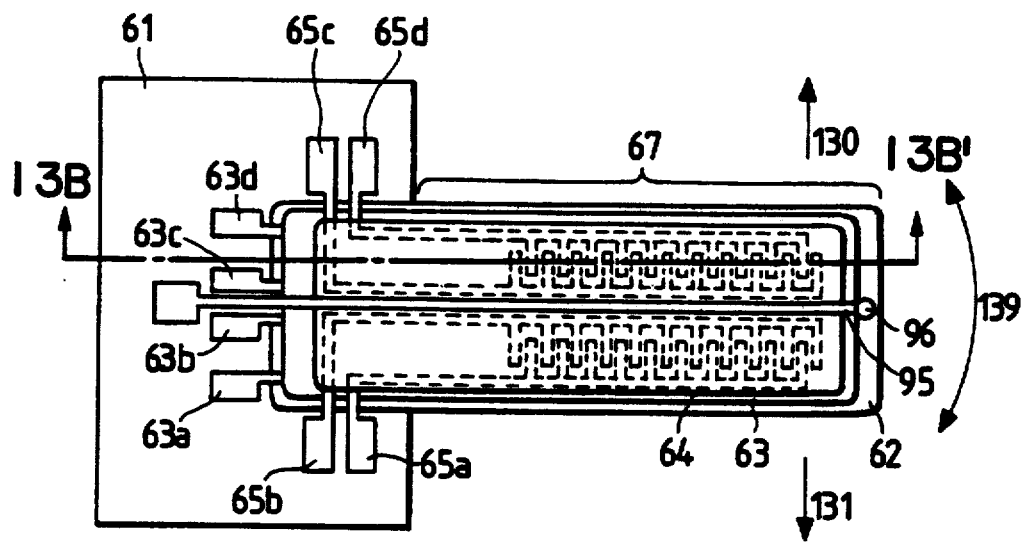
FIGS. 13A and 13B are views illustrating the second example of the probe in which the second cantilever type displacement element of the present invention is used.
Figure 13B:
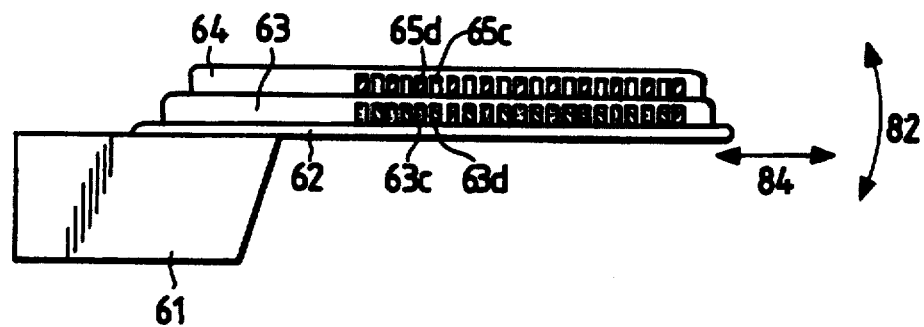

FIGS. 13A and 13B show an example of the second cantilever type displacement element of the present invention which is different from that of Example 4.

FIG. 13A is a plan, and FIG. 13B is a sectional view taken along the line 13B—13B'.

The feature of this example resides in that comb-shaped electrodes 63c, 63d, 65c, 65d are disposed in addition to the same comb-shaped electrodes 63a, 63b and 65a, 65b as in Example 4. The electrodes 63c, 63d are disposed in the layer in which the electrodes 63a, 63b are present, and similarly the electrodes 65c, 65d are disposed in the layer in which the electrodes 65a, 65b are present. Furthermore, the electrodes 63c, 63d and 65c, 65d have a structure symmetrical to the electrodes 63a, 63b and 65a, 65b.

Such a structure can be easily formed only by changing the shape of a photomask for the photolithography in forming the comb-shaped electrodes in Example 4, and the other preparation steps may be the same as in Example 4.

The above-mentioned constitution permits moving the cantilever portion 67 in another direction denoted by an arrow 139 in addition to the movable directions denoted by arrows 82, 84.

That is, the drive voltage is applied to the electrodes 63a, 63b and 65a, 65b to stretch either piezoelectric layer of the cantilever portion 67, so that the cantilever portion 67 is slightly displaced in a direction shown by an arrow 130. Conversely, when the drive voltage is applied to the electrodes 63c, 63d and 65c, 65d to stretch the other piezoelectric layer, so that the cantilever portion 67 can be slightly displaced in a direction shown by an arrow 131.

In consequence, in this example, the cantilever portion can be slightly displaced in all the directions of X, Y and Z, whereby triaxial drive is possible.

Example 6

Figure 20:
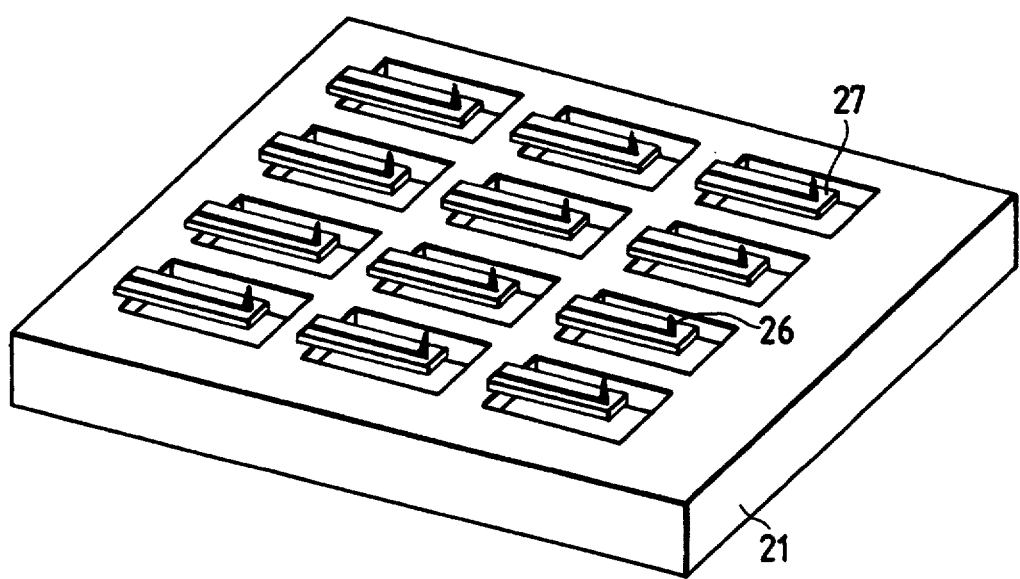
FIG. 20 is a view illustrating multi-cantilever type probes of the present invention.

Multi-cantilever type probes shown in FIG. 20 are prepared.

In this example, a plurality of cantilever portions 27 are arranged in an Si substrate 21, and a conductive probe 26 is formed on the tip of each cantilever portion 27.

In each cantilever portion 27, there are disposed piezoelectric layers 63, 64 and comb-shaped electrodes described in Example 5, and each cantilever portion 27 can be slightly displaced in a direction in the plane of a substrate 21 and in a vertical direction.

The above-mentioned structure can be formed only by expanding the pattern for photolithography in the preparation method described in Example 4, and the plurality of displacement elements can be formed with a high dimensional accuracy by one process.

The sizes of the respective members in this example are as follows:

Si substrate 21: 40 mm×40 mm×1 mm.

Cantilever portion 27: length=200 μm, width=50 μm.

Probe 26: length=3 μm.

Number of cantilever portions 27=90.

In this example, an Si single crystal is used as the material for the substrate 21, and therefore it is possible to integrate, into the one substrate, transistors for the drive voltage application to the comb-shaped electrodes and amplifiers for the amplification of signals from the probes 26.

Example 7

Figure 14:
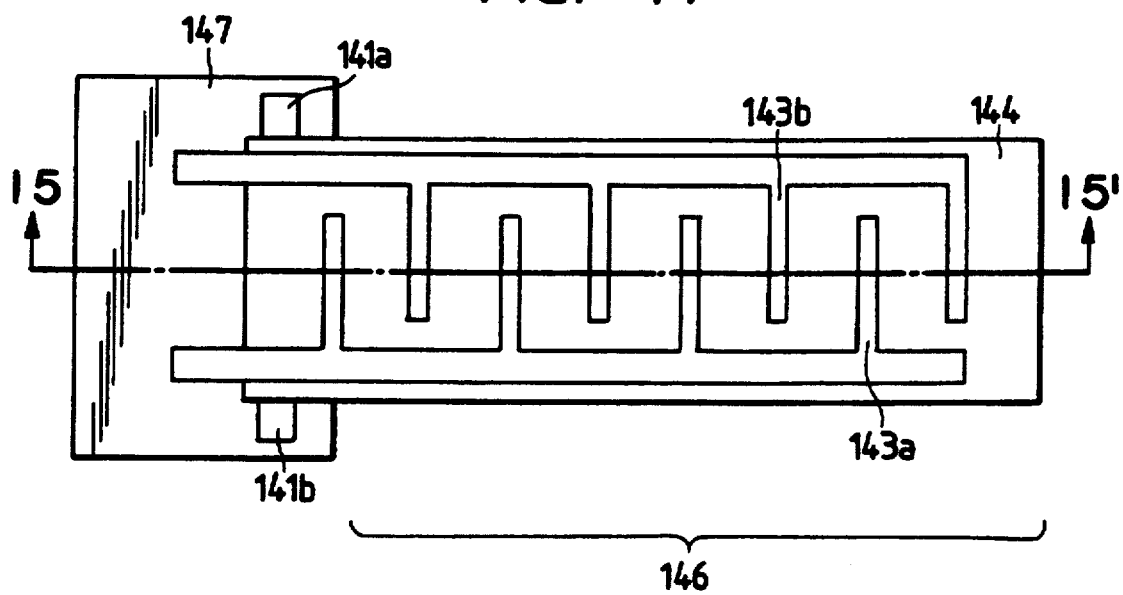
FIG. 14 is a plan of one example of a third cantilever type displacement element of the present invention.

FIG. 14 shows an example of the third cantilever type displacement element of the present invention.

Figure 15:
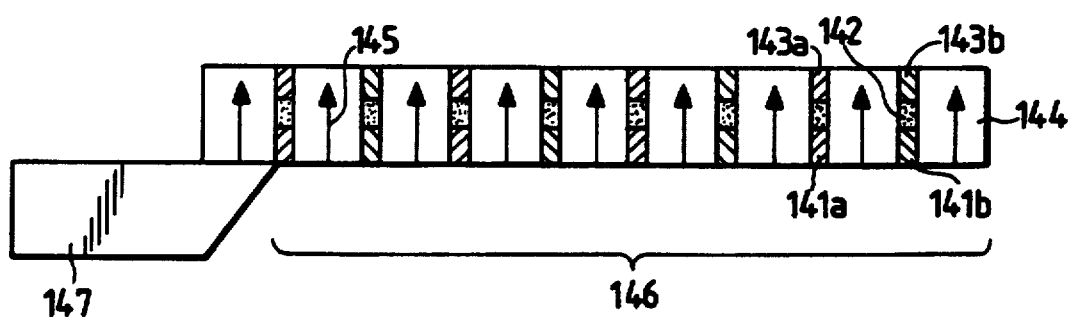
FIG. 15 is a sectional view of one example of the third cantilever type displacement element of the present invention.

FIG. 15 is a sectional view taken along the dotted line A—A' in FIG. 14.

In FIG. 14, reference numerals 141a, 141b are comb-shaped electrodes which face each other and which comprise a lower layer portion of the element, and numeral 142 is an insulating layer for separating upper electrodes from lower electrodes, and 143a, 143b are comb-shaped electrodes which face each other and which comprise an upper layer portion of the element.

Numeral 144 is a piezoelectric layer, and this piezoelectric layer 144 is formed so as to have a polarization axis in a direction denoted by an arrow 145.

The above-mentioned constitution results in the formation of the cantilever portion 146, and its one end is fixed on the substrate 147.

Figure 16A:
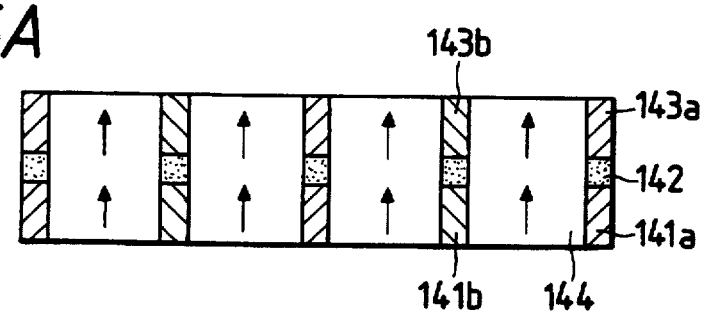
FIGS. 16A to 16C are views illustrating the functional principle of the third cantilever type displacement element of the present invention.
Figure 16B:
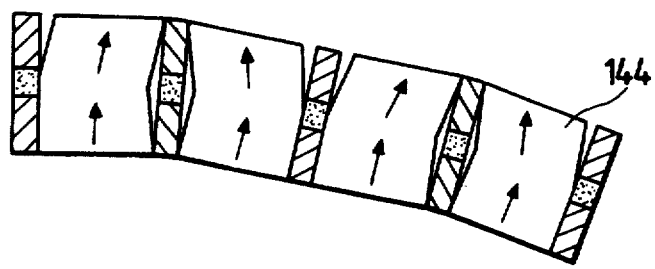
Figure 16C:
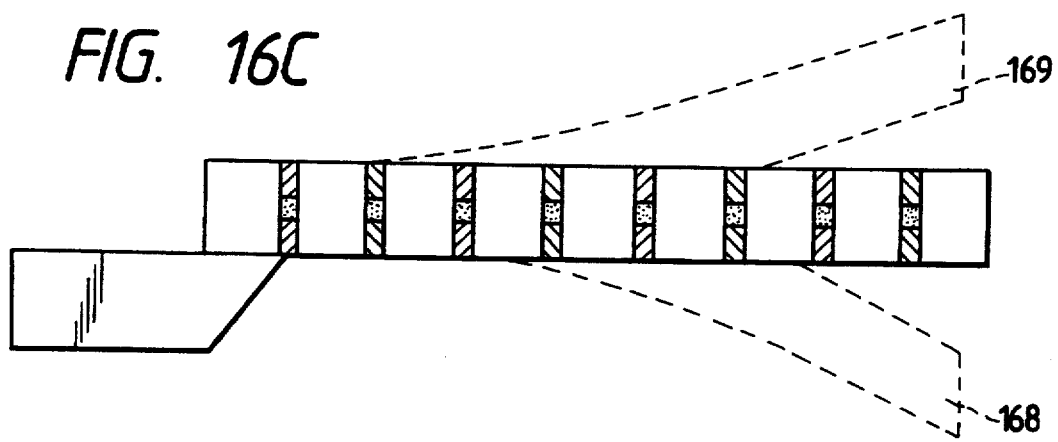

FIGS. 16A to 16C show the operation principle of the cantilever type displacement element in this example.

FIG. 16A enlargedly shows the voltage-unapplied state of a section containing the comb-shaped electrodes 141a, 141b, 143a, 143b, the insulating layer 142 and the piezoelectric layer 144 in FIG. 14.

When a predetermined voltage is applied to the upper electrodes 143a, 143b, the upper layer portion is only deformed due to a thickness slide deformation $d_{15}$, as shown in FIG. 16B. That is, the upper electrodes 143a, 143b are deformed alternately in opposite directions, as in the case of 144a, 144b. Since any voltage is not applied to the comb-shaped electrodes in the lower layer portion, the piezoelectric layer 144 is not deformed. In consequence, the upper layer portion generated strength to relatively spread the lower layer portion, with the result that the cantilever portion 146 is bent downward. In the case that the polarity of the voltage which is applied to the electrodes 143a, 143b is reversed, the cantilever portion 146 is similarly bent downward, only though directions of the deformation 144a, 144b of the piezoelectric layer are mutually reversed.

Conversely, when the voltage is applied to the lower electrodes 141a, 141b, the cantilever portion 146 is bent upward in accordance with the same mechanism as described above. FIG. 16C shows the state of the bent cantilever portion 146. The cantilever portion is bent toward positions denoted by dotted lines 168, 169.

As describe above, the application of the voltage to the two upper and lower layers permits moving the cantilever tip portion as much as an optional slight distance.

Next, one example of a preparation method of the cantilever type displacement element according to the present invention will be described in reference to FIGS. 17A–17F.

Figure 17A:
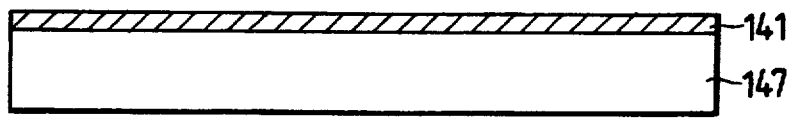
FIGS. 17A to 17F are views illustrating a preparation process of the third cantilever type displacement element of the present invention.

(a) Cr is vapor-deposited as thick as about 5 to 10 Å on a P type single crystal Si substrate 147 of surface orientation (100) for the sake of secure adhesive properties. On this Cr film, Pd is vapor-deposited as thick as 3000 Å, and Cr is further vapor-deposited so as to obtain a thickness of 10 to 20 Å, thereby forming a lower electrode layer 141 (FIG. 17A).

Figure 17B:
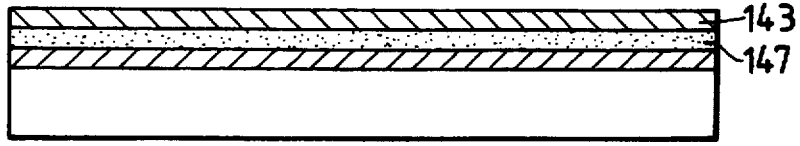

(b) Next, an $SiO_2$ film having a thickness of 1000 Å is formed by a sputtering process to obtain an insulating layer 142. On this insulating layer 142, Cr is vapor-deposited as thick as 10 to 20 Å in order to secure adhesive properties, and afterward an Au film having a thickness of 3000 Å is further formed (FIG. 17B).

Figure 17C:
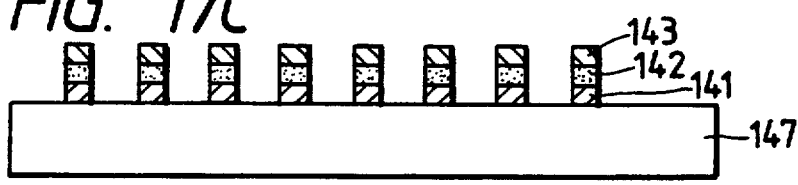

(c) A photoresist is applied onto the thus laminated layer, and a comb-shaped pattern is then formed by an ultraviolet light exposing device. Afterward, a pattern formation is successively carried out with etching solutions suitable for the respective metals. The etching solutions are a KI-$I_2$ based etching solution for Au, a $(NH_4)_2Ce(NO_3)_6$—$HClO_4$—$H_2O$ based etching solution for Cr, and an $FeCl_3$—HCl—$H_2O$ based etching solution for Pd. Furthermore, in order to etch $SiO_2$ which is used as the insulating layer, an HF based etching solution is used (FIG. 17C).

The patterning is made by the above-mentioned etching operations to form comb-shaped electrodes 141a, 141b, 143a and 143b.

Figure 17D:
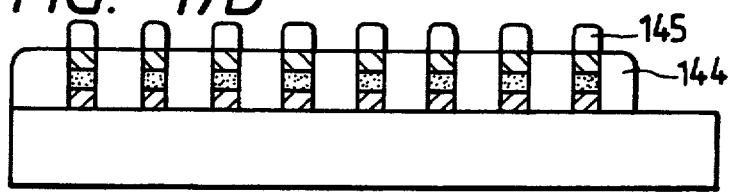

(d) Next, a ZnO film having a thickness of 8000 Å is deposited by sputtering to form a piezoelectric layer 4 (FIG. 17D).

Figure 17E:
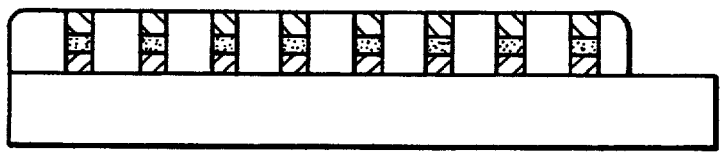

(e) Photolithography is utilized again in order to remove the ZnO portions present on the electrodes 143a, 143b of the ZnO film deposited all over the surface in the above-mentioned step (c), whereby the unnecessary portions of ZnO are removed. As an etching solution, an aqueous acetic acid solution is used. Afterward, a probe or the like is formed on the tip of the cantilever portion 146 in compliance with a purpose (FIG. 17E).

Figure 17F:
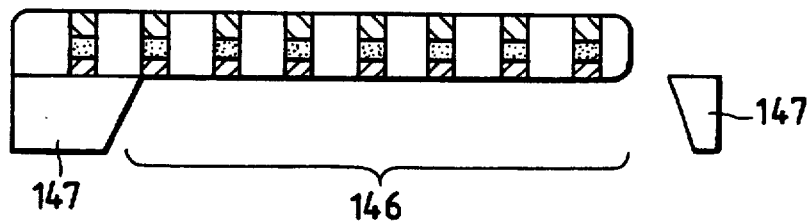

(f) After completion of all the processing operations on the surface side of the Si substrate 147, the back surface of the Si substrate 147 is etched to form the cantilever portion 146. For the etching, a KOH solution is used, and processing is carried out by the utilization of anisotropic etching properties of the Si single crystal (FIG. 17F).

In this example, the cantilever type displacement element shown in FIG. 14 is formed by the above-mentioned procedures, but as a material for the piezoelectric layer 144, any material such as AlN may be used, so long as it has characteristics by which a polarization axis is liable to vertically orient to the surface of the substrate in forming the film.

Furthermore, the materials of the comb-shaped electrodes 141a, 141b, 143a and 143b as well as the insulating layer 142 are not limited to those used in this example, and other materials are also acceptable, so long as their processing properties meet the necessary requirements.

The following shows the sizes of the respective parts of the cantilever prepared in this example and a displacement in the case that a voltage is actually applied.

Cantilever portion 146: length=200 μm, width=50 μm.

In the comb-shaped electrodes 141a, 141b, 143a, 143b:

Comb-shaped portion: electrode width=2 μm, thickness=0.3 μm.

Space between the faced comb portions=2 μm.

Number of teeth of the comb=50.

Thickness of the piezoelectric layer 144=0.8 μm.

When a voltage of 10 V is alternately applied to the electrodes 141a, 141b and 143a, 143b of the cantilever type displacement element having the above-mentioned constitution, the displacement at the tip of the cantilever portion 146 is ±0.5 μm.

Example 8

Figure 18:
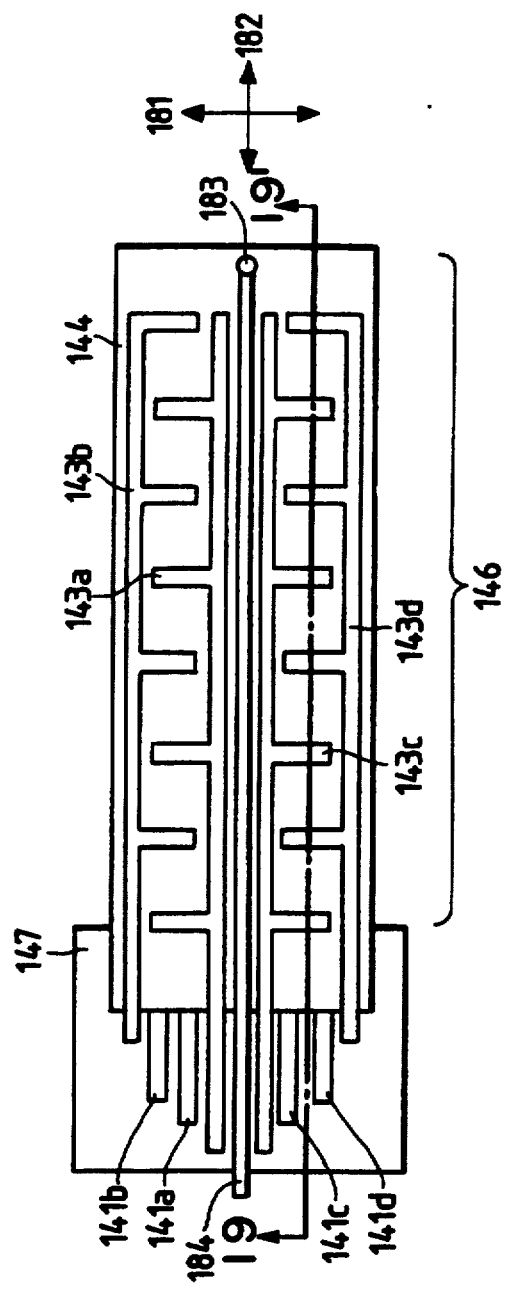
FIG. 18 is a plan of the probe in which the third cantilever type displacement element of the present invention is used.

FIG. 18 shows an example of the third displacement element of the present invention which is different from that of Example 7.

Figure 19:
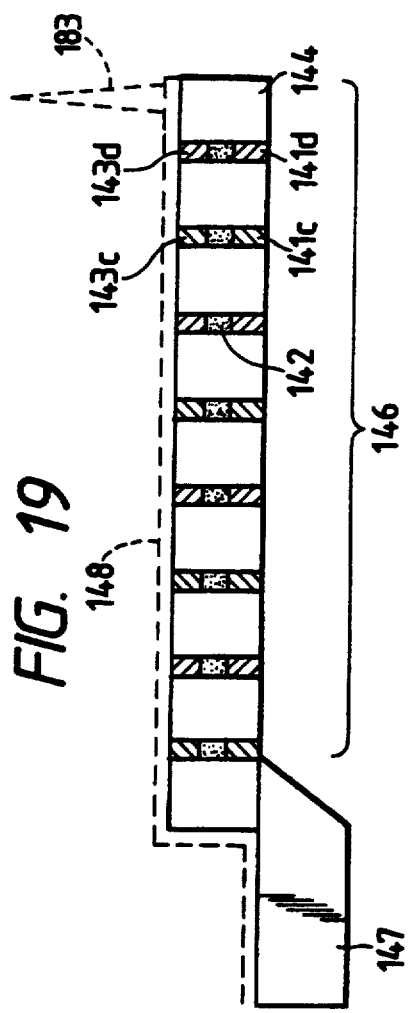
FIG. 19 is a sectional view of the probe in which the third cantilever type displacement element of the present invention is used.

FIG. 19 is a sectional view taken along the dotted line A—A' in FIG. 18.

In addition to the constitution described in Example 7, comb-shaped electrodes 141c, 141d, 143c, 143d are further disposed in a cantilever portion 146 so as to symmetrically face comb-shaped electrodes 141a, 141b, 143a, 143b with the center line of the cantilever portion 146 between.

The disposition of these electrodes 141c, 141d, 143c, 143d permits displacing the cantilever portion 146 newly in a Y direction denoted by an arrow 181 in addition to a Z direction denoted by an arrow 190. That is, when the voltage is applied only to the electrodes 141a, 141b, 143a, 143b, the side containing the above-mentioned electrodes 141a, 141b, 143a, 143b of the cantilever portion 146 is relatively stretched, with the result that the cantilever portion 146 is displaced toward an opposite side. Conversely, when the voltage is applied to the electrodes 141c, 141d, 143c, 143d, the cantilever portion 146 is displaced in a reverse direction.

In addition, when the voltage is simultaneously applied to all of the electrodes 141a, 141b, 141c, 141d and 143a, 143b, 143c, 143d, the cantilever portion 146 is uniformly stretched in a lengthwise direction, and therefore the displacement in a direction denoted by an arrow 182 is also possible.

In this example, a small conductive probe 183 having a sharp tip is provided on the tip of the cantilever portion 146, and an outgoing electrode 184 is also disposed which is electrically connected with the probe 183.

The cantilever type displacement element having the probe 183 on the tip thereof according to the present invention can be used as a probe for detecting a tunnel current in an STM or as a probe of an interatomic force microscope.

Example 9

A plurality of cantilever type displacement elements which can be slightly displaced in the three directions of X, Y and Z axes described in Example 8 are integrally formed on one Si substrate to prepare a multi-probe array shown in FIG. 20.

A probe 26 of Example 2 is formed on the tip of each cantilever portion 27.

This structure can be formed only by expanding the pattern for photolithography in the preparation method described in Example 7.

Thus, according to the present invention, it is possible to form many displacement elements on one substrate with a high dimensional accuracy at one time, and it is also possible to provide a scanning tunneling microscope and an atomic force microscope having the multi-probe array.

The sizes of the respective members in this example are as follows.

Si substrate 21: 40 mm×40 mm×1 mm.

Cantilever portion 27: length=200 μm, width=50 μm.

Probe 26: length=3 μm.

Number of cantilever portions 27=90.

In this example, an Si single crystal is used as the substrate 21, and therefore it is possible to integrate, into the one substrate, transistors for the drive voltage application to the comb-shaped electrodes and amplifiers for the amplification of signals from the probes 26.

Example 10

Figure 21:
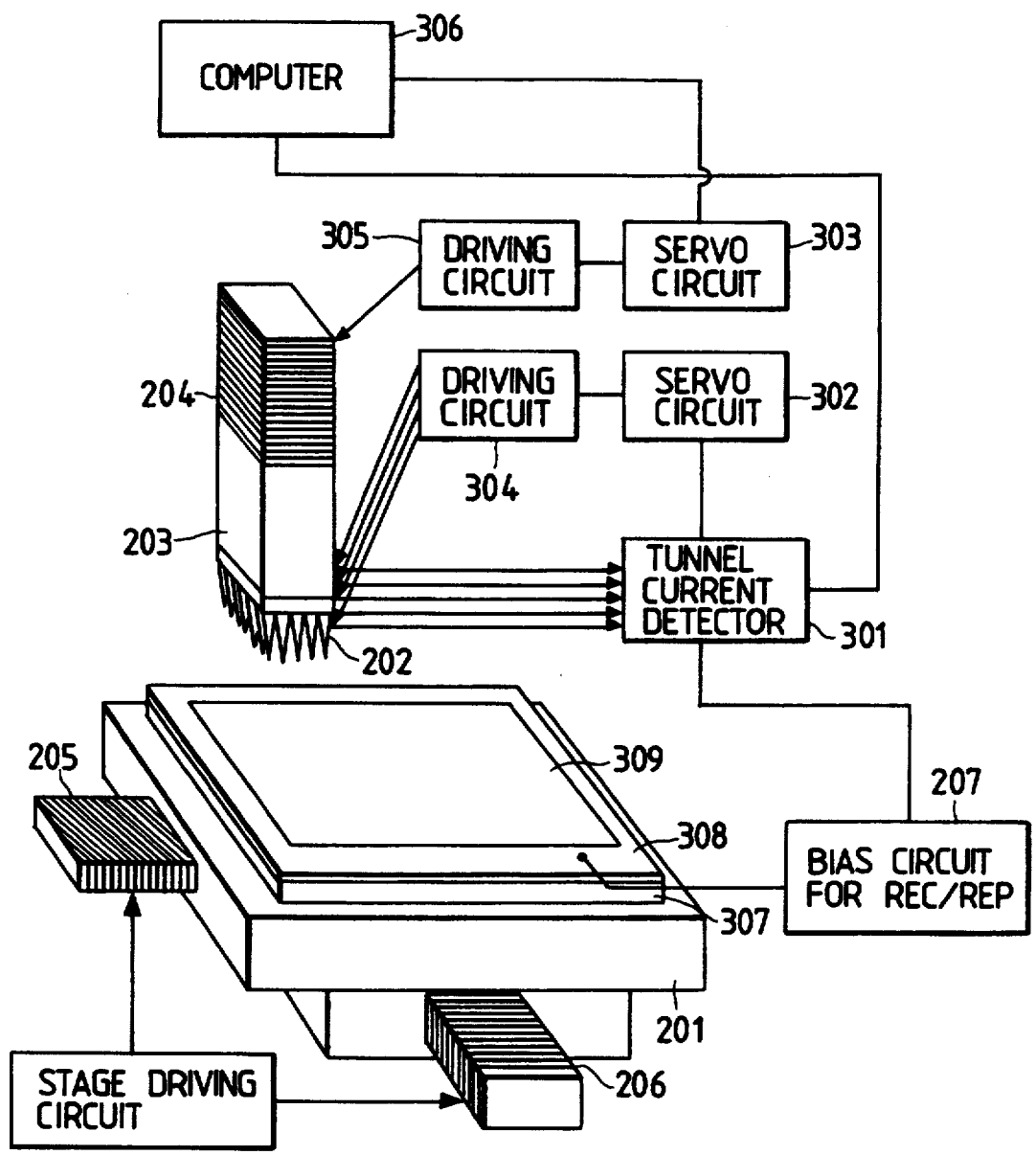
FIG. 21 is a view illustrating an information processor of the present invention.
Figure 22A:
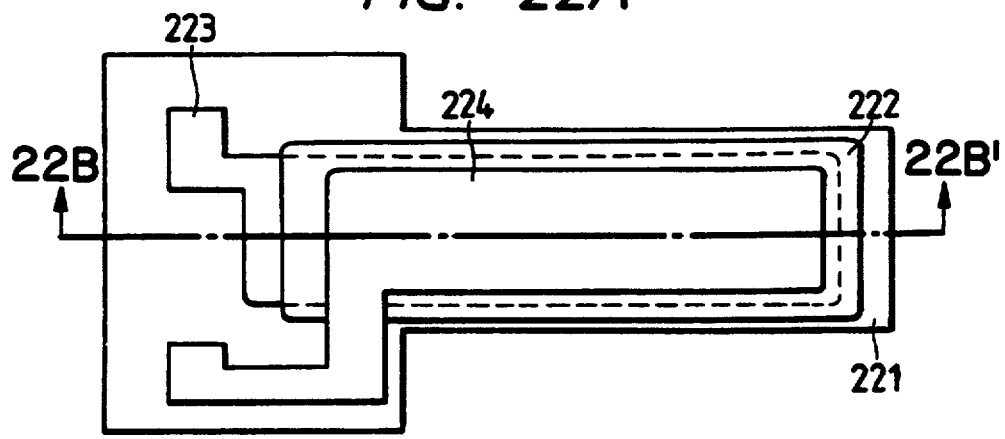
FIGS. 22A and 22B are views illustrating a conventional example of the cantilever type displacement element.
Figure 22B:
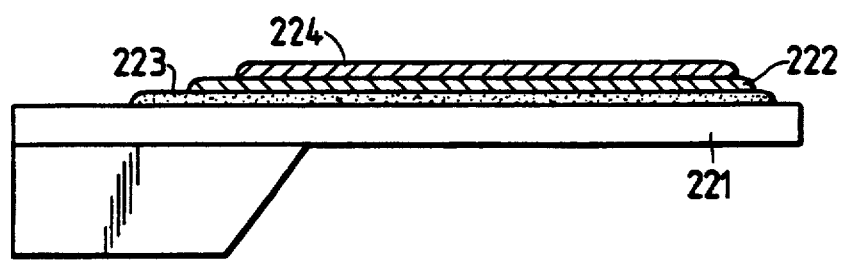

FIG. 21 shows an information processing apparatus of the present invention. In FIG. 21, reference numeral 307 is a substrate of a medium, numeral 308 is a metallic electrode layer, and 309 is a recording layer. Furthermore, numeral 201 is an XY stage, 202 is a probe, 203 is a support for a cantilever, 204 is a linear actuator for driving the cantilever in a Z direction, 205 and 206 are linear actuators for driving the XY stage in X and Y directions, respectively, and 207 is a bias circuit for recording/reproduction. Numeral 301 is a tunnel current detector for recording/reproduction by which a current flowing from the probe to an electrode layer 308 through a recording layer 309 is detected. Numeral 302 is a servo circuit for moving the cantilever in the Z axis direction, and 303 is a servo circuit for driving the actuator 204. Numeral 304 is a driving circuit for moving the plurality of cantilevers in the Z axis direction, and 305 is a driving circuit for controlling the position of the XY stage. 306 is a computer for controlling theses operations.

As described above, according to the first displacement element of the present invention, (1) the innerplane strain of a cantilever type displacement element can be reduced, and in consequence, mechanical resonance frequency properties can be stabilized, and (2) it is possible to increase a displacement by the cantilever type probe.

Furthermore, according to the second displacement element of the present invention, (3) a reverse piezoelectric effect defined by a piezoelectric constant $d_{33}$ is utilized to increase the displacement of the cantilever, (4) the cantilever can be blent in upper and lower directions without using any elastic members, and therefore, there can be prevented the warp of the cantilever which occurs owing to a difference between thermal expansion coefficients of the elastic members and the cantilever, (5) the disposition of additional pair of comb-shaped electrodes in one piezoelectric layer of the cantilever permits a slight displacement in an X-Y surface, whereby three-axis direction drive is possible, (6) when the probe is disposed on the tip of the cantilever and is used as a probe of an STM, the apparatus of the STM can be remarkably miniaturized, and (7) since the displacement element and the probe are formed by techniques of thin film formation and photolithographic patterning, miniaturization and integration are possible, whereby the STM having a multi-probe array can be obtained.

According to the third displacement element of the present invention, (8) a thickness slide deformation $d_{15}$ which cannot be utilized in a parallel plate electrode can be converted into the bending of the cantilever, (9) in many materials, a piezoelectric constant $d_{15}$ is larger than a piezoelectric constant $d_{31}$, and therefore it is possible to make the displacement of the cantilever larger than that of the parallel plate electrode,

(10) since the formation of the piezoelectric layer is done by one film formation operation, it is easy to make the piezoelectric properties of the upper portion of the piezoelectric layer equal to those of the lower portion thereof, so that the precise operation can be achieved,

(11) the occurrence rate of electrical insulation failure by pinholes in a film thickness direction which tend to take place in forming the thin films is lower, as compared with the parallel plate electrode structure, and thus the yield of products and durability can be remarkably improved,

(12) the increase of the comb-shaped electrode pairs permits the slight displacement in an X-Y plane, whereby three-axis direction drive can be achieved,

(13) since the preparation method comprises the thin film formation using a vapor deposition technique and the pattern formation by photolithography, techniques which are used in semiconductor integrated circuits can be directly employed, so that miniaturization and integration are possible, and

(14) it is possible to prepare an integrated STM having multi-probe array and an integrated atomic force microscope.

What is claimed is:

1. A cantilever type displacement element comprising a piezoelectric layer and at least two pairs of electrodes for applying a voltage to said piezoelectric layer, at least one of said electrode pairs being a comb-shaped electrode pair having respectively comb-tooth portions disposed separately as facing and alongside of each other in the width direction of the cantilever.

2. The displacement element of claim 1, wherein said electrode pair are provided on both the surfaces of said piezoelectric layer.

3. The displacement element of claim 1, wherein said piezoelectric layer has a two-layer laminate structure and another electrode different from the electrode pair is interposed therebetween.

4. The displacement element of claim 1, wherein said piezoelectric layer is made of zinc oxide.

5. The displacement element of claim 1, wherein said piezoelectric layer is made of a ferroelectric material.

6. A cantilever type displacement element comprising a first piezoelectric layer, a second piezoelectric layer laminated thereon, and a comb-shaped electrode pair provided in each of said first and second piezoelectric layers for applying a voltage displacing the first and second piezoelectric layers by reverse piezoelectric effect, each of said electrode pairs having respectively comb-tooth portions disposed separately as facing and alongside of each other in the width direction of the cantilever.

7. The displacement element of claim 6, wherein said first and second electrode pairs are electrically insulated from each other.

8. The displacement element of claim 6, wherein said piezoelectric layers are made of zinc oxide.

9. The displacement element of claim 6, wherein said piezoelectric layers are made of a ferroelectric material.

10. The displacement element of claim 6, wherein said piezoelectric layers have been given a polarizing treatment.

11. A displacement element as in any one of claims 1–10, wherein a couple of electrode pairs are provided on one surface.

12. A displacement element as in any one of claims 1–10, wherein a couple of electrode pairs are provided on one surface and wherein said couple of electrode pairs are disposed symmetrically in the width direction of the element.

13. A displacement element as in any one of claims 1–10, wherein a probe and an outgoing electrode connected thereto are further provided.

14. A displacement element as in any one of claims 1–10 wherein a plural number of the displacement elements form a displacement element array.

15. A displacement element as in any one of claims 1–10, wherein said probe is made of an electrical conductor.

16. A displacement element as in any one of claims 1-10, wherein a couple of electrode pairs are provided on one surface and wherein a probe and an outgoing electrode connected thereto are further provided.

17. A displacement element as in any one of claims 1-10, wherein a couple of electrode pairs are provided on one surface, said couple of electrode pairs are disposed symmetrically in the width direction of the element and a probe and an outgoing electrode connected to the probe are further provided.

18. A displacement element as in any one of claims 1-10, wherein a couple of electrode pairs are provided on one surface and wherein a plural number of the displacement elements form a displacement element array.

19. The displacement element as in any one of claims 1-10, wherein a couple of electrode pairs are provided on one surface, said couple of electrode pairs are disposed symmetrically in the width direction of the element and wherein a plural number of the displacement elements form a displacement element array.

20. The displacement element as in any one of claims 1-10, wherein a couple of electrode pairs are provided on one surface, a probe and an outgoing electrode connected thereto are further provided and wherein a plural number of the displacement elements form a displacement element array.

21. The displacement element as in any one of claims 1-10, wherein a couple of electrode pairs are provided on one surface, said couple of electrode pairs are disposed symmetrically in the width direction of the element, a probe and an outgoing electrode connected thereto are further provided and wherein a plural number of the displacement elements form a displacement element array.

22. A displacement element as in any one of claims 1-10, wherein a couple of electrode pairs are provided on one surface and said probe is made of an electrical conductor.

23. A displacement element as in any one of claims 1-10, wherein a couple of electrode pairs are provided on one surface, said couple of electrode pairs are disposed symmetrically in the width direction of the element and said probe is made of an electrical conductor.

24. A displacement element as in any one of claims 1-10, wherein a couple of electrode pairs are provided on one surface, said couple of electrode pairs are disposed symmetrically in the width direction of the element, a probe and an outgoing electrode connected to the probe are further provided, and said probe is made of an electrical conductor.

25. A scanning tunneling microscope comprising:
a cantilever type displacement element including a piezoelectric layer and at least two pairs of electrodes for applying a voltage to said piezoelectric layer, at least one of said electrode pairs being a comb-shaped electrode pair having respectively comb-tooth portions disposed separately as facing and alongside of each other in the width direction of the cantilever,
a probe and an outgoing electrode connected to the probe, and
means for displaying/driving said element and a voltage application circuit connected to the probe and to the outgoing electrode of said element,
said probe being positionable in close proximity of a sample to be observed for applying a voltage therebetween to generate an electrical current and detecting the current to output the surface information of the sample based on the current detected.

26. A scanning tunneling microscope according to claim 25, wherein said probe is made of an electrical conductor.

27. An information processing apparatus comprising a cantilever type displacement element including a piezoelectric layer and at least two pairs of electrodes for applying a voltage to said piezoelectric layer, at least one of said electrode pairs being a comb-shaped electrode pair having respectively comb-toothed portions disposed separately as facing and alongside of each other in the width direction of the cantilever,
a probe and an outgoing electrode connected to the probe,
means for displaying/driving said element and a voltage application circuit connected to the probe and to the outgoing electrode of said element,
said probe being positionable in close proximity of a recording medium for applying a voltage therebetween to write and/or read an information into or out of said medium.

28. An information processing apparatus according to claim 27, wherein said probe is made of an electrical conductor.

29. A scanning tunneling microscope comprising:
a cantilever type displacement element including a first piezoelectric layer, a second piezoelectric layer laminated thereon, and a comb-shaped electrode pair provided in each of said first and second piezoelectric layers for applying a voltage displacing the first and second piezoelectric layers by a reverse piezoelectric effect, each of said electrode pairs having respectively comb-tooth portions disposed separately as facing and alongside of each other in the width direction of the cantilever,
a probe and an outgoing electrode connected to the probe,
means for displacing/driving said element and a voltage application circuit connected to the probe and to the outgoing electrode of said element,
said probe being positionable in a close proximity of a sample to be observed for applying a voltage therebetween to generate an electrical current and detecting the current to output the surface information of the sample based on the current detected.

30. A scanning tunneling microscope according to claim 29, wherein said probe is made of an electrical conductor.

31. A scanning tunneling microscope comprising:
a plural number of cantilever type displacement elements each including a piezoelectric layer and at least two pairs of electrodes for applying a voltage to said piezoelectric layer, at least one of said electrode pairs being a comb-shaped electrode pair having respectively comb-tooth portions disposed separately as facing and alongside of each other in the width direction of the cantilever,
a probe and an outgoing electrode connected to the probe, and
means for displacing/driving each of said elements and a voltage application circuit connected to the probe and to the outgoing electrode of each of said elements,
said probe being positionable in close proximity of a sample to be observed for applying a voltage therebetween to generate an electrical current and detecting the current to output the surface information of the sample based on the current detected.

32. A scanning tunneling microscope comprising:

a plural number of cantilever type displacement elements each including a first piezoelectric layer, a second piezoelectric layer laminated thereon, and a comb-shaped electrode pair provided in each of said first and second piezoelectric layers for applying a voltage displacing the first and second piezoelectric layers by a reverse piezoelectric effect, each of said electrode pairs having respectively comb-tooth portions disposed separately as facing and alongside of each other in the width direction of the cantilever, a probe and an outgoing electrode connected to the probe for each of said elements, and means for displacing/driving each of said elements and a voltage application circuit connected to the probe and to the outgoing electrode of each of said elements, said probe being positionable in close proximity of a sample to be observed for applying a voltage therebetween to generate an electrical current and detecting the current to output the surface information of the sample based on the current detected.

33. An information processing apparatus comprising a cantilever type displacement element including a first piezoelectric layer, a second piezoelectric layer laminated thereon, and a comb-shaped electrode pair provided in each of said first and second piezoelectric layers for applying a voltage displacing the first and second piezoelectric layers by a reverse piezoelectric effect, each of said electrode pairs having respectively comb-tooth portions disposed separately as facing and alongside of each other in the width direction of the cantilever, a probe and an outgoing electrode connected to the probe, and means for displacing/driving said element and a voltage application circuit connected to the probe and to the outgoing electrode of said element, said probe being positionable in close proximity of a recording medium for applying a voltage therebetween to write and/or read an information into or out of said medium.

34. An information processing apparatus according to claim 33, wherein said probe is made of an electrical conductor.

35. An information processing apparatus comprising a plural number of cantilever type displacement elements each including a piezoelectric layer and at least two pairs of electrodes for applying a voltage to said piezoelectric layer, at least one of said electrode pairs being a comb-shaped electrode pair having respectively comb-tooth portions disposed separately as facing and alongside of each other in the width direction of the cantilever, a probe and an outgoing electrode connected to the probe for each of the elements, and means for displacing/driving each of said elements and a voltage application circuit connected to the probe and to the outgoing electrode of each of said elements, said probe being positionable in close proximity of a recording medium for applying a voltage therebetween to write and/or read an information into or out of said medium.

36. An information processing apparatus comprising a plural number of cantilever type displacement elements each including a first piezoelectric layer, a second piezoelectric layer laminated thereon, and a comb-shaped electrode pair provided in each of said first and second piezoelectric layers for applying a voltage displacing the first and second piezoelectric layers by a reverse piezoelectric effect, each of said electrode pairs having respectively comb-tooth portions disposed separately as facing and alongside of each other in the width direction of the cantilever, a probe and an outgoing electrode connected to the probe for each of the elements, and means for displacing/driving each of said elements and a voltage application circuit connected to the probe and to the outgoing electrode of each of said elements, said probe being positionable in close proximity of a recording medium for applying a voltage therebetween to write and/or read an information into or out of said medium.

* * * * *

UNITED STATES PATENT AND TRADEMARK OFFICE
CERTIFICATE OF CORRECTION

PATENT NO. : 5,357,108

DATED : October 18, 1994

INVENTORS : YOSHIO SUZUKI ET AL.

It is certified that error appears in the above-identified patent and that said Letters Patent is hereby corrected as shown below:

ON THE TITLE PAGE:

At [56] References Cited

Under Etching: "Technology A" should read --Technology A;--.

COLUMN 2

Line 22, "moved" should be deleted.
Line 47, "defroma-" should read --deforma--.

COLUMN 11

Line 28, "so that" should be deleted.

COLUMN 12

Line 2, "A-A'" should read --15-15'--.
Line 37, "only though" should read --although--.
Line 46, "describe" should read --described--.

UNITED STATES PATENT AND TRADEMARK OFFICE
CERTIFICATE OF CORRECTION

PATENT NO. : 5,357,108

DATED : October 18, 1994

INVENTORS : YOSHIO SUZUKI ET AL.

It is certified that error appears in the above-identified patent and that said Letters Patent is hereby corrected as shown below:

COLUMN 13

Line 68, "A-A'" should read --19-19'--.

COLUMN 15

Line 31, "blent" should read --bent--.

COLUMN 16

Line 64, "1-10" should read --1-10,--.

Signed and Sealed this

Sixteenth Day of May, 1995

Attest:

BRUCE LEHMAN

Attesting Officer

Commissioner of Patents and Trademarks